United States Patent
Martineau

(10) Patent No.: US 8,749,081 B2
(45) Date of Patent: Jun. 10, 2014

(54) MOVING FLUID ENERGY CONVERSION DEVICE

(76) Inventor: Phillip Reed Martineau, Salt Lake City, UT (US)

(*) Notice: Subject to any disclaimer, the term of this patent is extended or adjusted under 35 U.S.C. 154(b) by 580 days.

(21) Appl. No.: 13/068,349

(22) Filed: May 9, 2011

(65) Prior Publication Data

US 2011/0215671 A1 Sep. 8, 2011

(51) Int. Cl.
*F03B 13/00* (2006.01)
*H02P 9/04* (2006.01)

(52) U.S. Cl.
USPC .............................................. 290/43; 290/54

(58) Field of Classification Search
USPC ................... 290/43, 54, 44, 55; 310/339, 800
See application file for complete search history.

(56) References Cited

U.S. PATENT DOCUMENTS

| | | | |
|---|---|---|---|
| 6,768,246 B2 | 7/2004 | Pelrine | |
| 6,940,211 B2 | 9/2005 | Pelrine | |
| 6,982,497 B2 | 1/2006 | Rome | |
| 7,034,432 B1 | 4/2006 | Pelrine | |
| 7,049,732 B2 | 5/2006 | Pei | |
| 7,208,845 B2 * | 4/2007 | Masters et al. | 290/1 R |
| 7,368,862 B2 | 5/2008 | Pelrine | |
| 7,391,123 B2 | 6/2008 | Rome | |
| 7,508,085 B2 | 3/2009 | Martineau | |
| 7,557,456 B2 | 7/2009 | Kornbluh | |
| 7,944,071 B2 * | 5/2011 | Nair et al. | 290/44 |
| 2003/0214199 A1 * | 11/2003 | Heim et al. | 310/309 |
| 2007/0164641 A1 * | 7/2007 | Pelrine et al. | 310/800 |
| 2008/0203850 A1 * | 8/2008 | Martineau | 310/309 |

FOREIGN PATENT DOCUMENTS

| | | |
|---|---|---|
| JP | 2010077923 | 4/2010 |
| WO | WO2009144427 | 12/2009 |

* cited by examiner

*Primary Examiner* — Julio Gonzalez

(57) ABSTRACT

Moving fluid energy conversion device (90) converts mechanical energy contained in moving fluid (16) to electrical energy. Moving fluid energy conversion device (90) comprises one or more transducers (10), a charge exchange means (600), a charge element (62) and a recovery element (65). Transducer (10) is comprised of one or polymer spacers (502) sandwiched between one or more top electrodes (504) and bottom electrode (506) pairs. Moving fluid energy conversion device (90) produces electrical energy by transferring electric charge from charge element (62), through charge exchange means (600) to transducer (10) in stretched state (6). Transducer (10) is then allowed to return to relaxed state (8). The charge in transducer (10) increases in energy when the transducer (10) returns to relaxed state (8). The increased energy electric charge flows to recovery element (65) through charge exchange means (600).

6 Claims, 19 Drawing Sheets

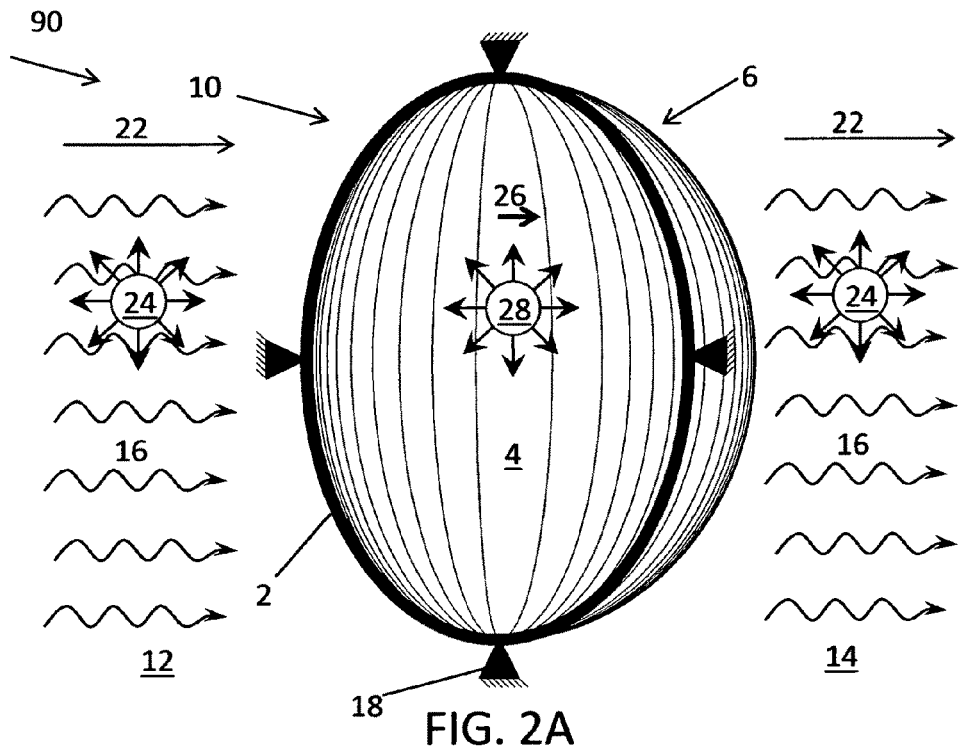
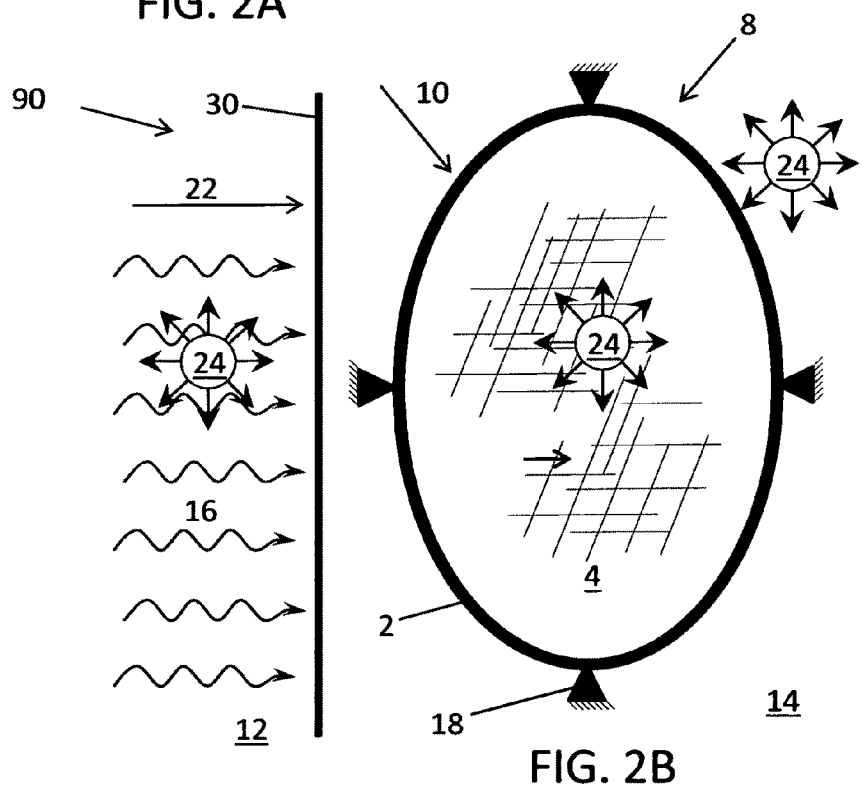

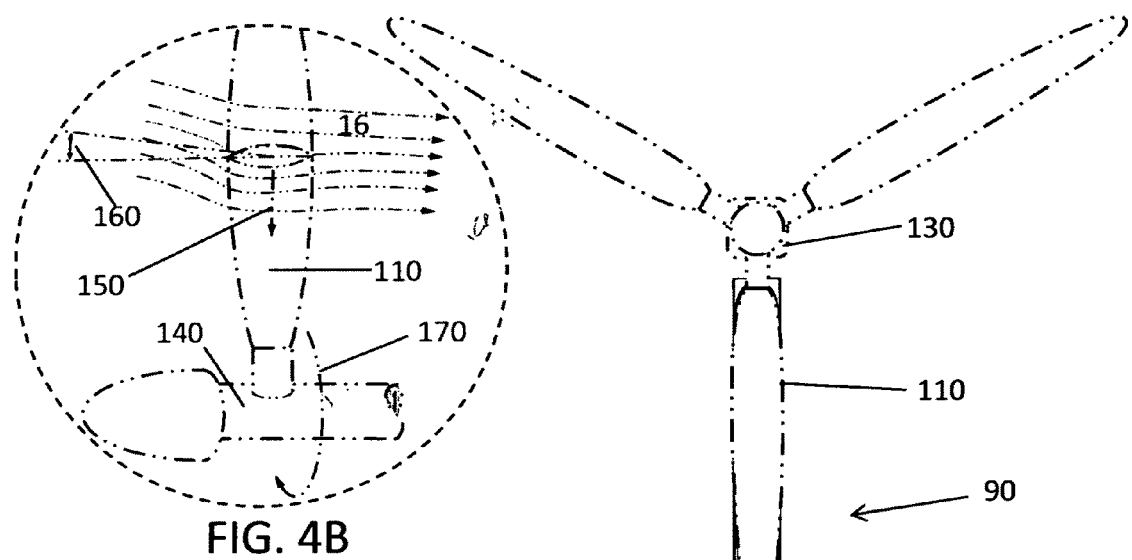
FIG. 4B
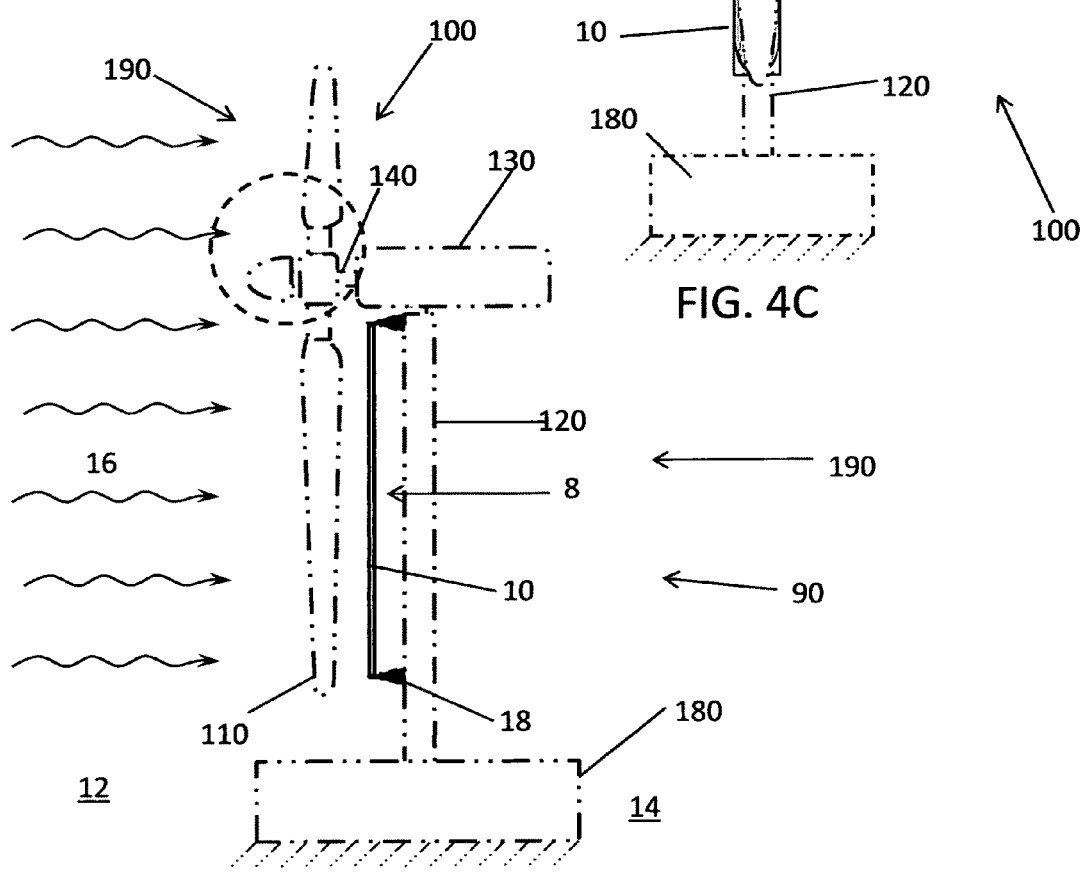
FIG. 4C
FIG. 4A

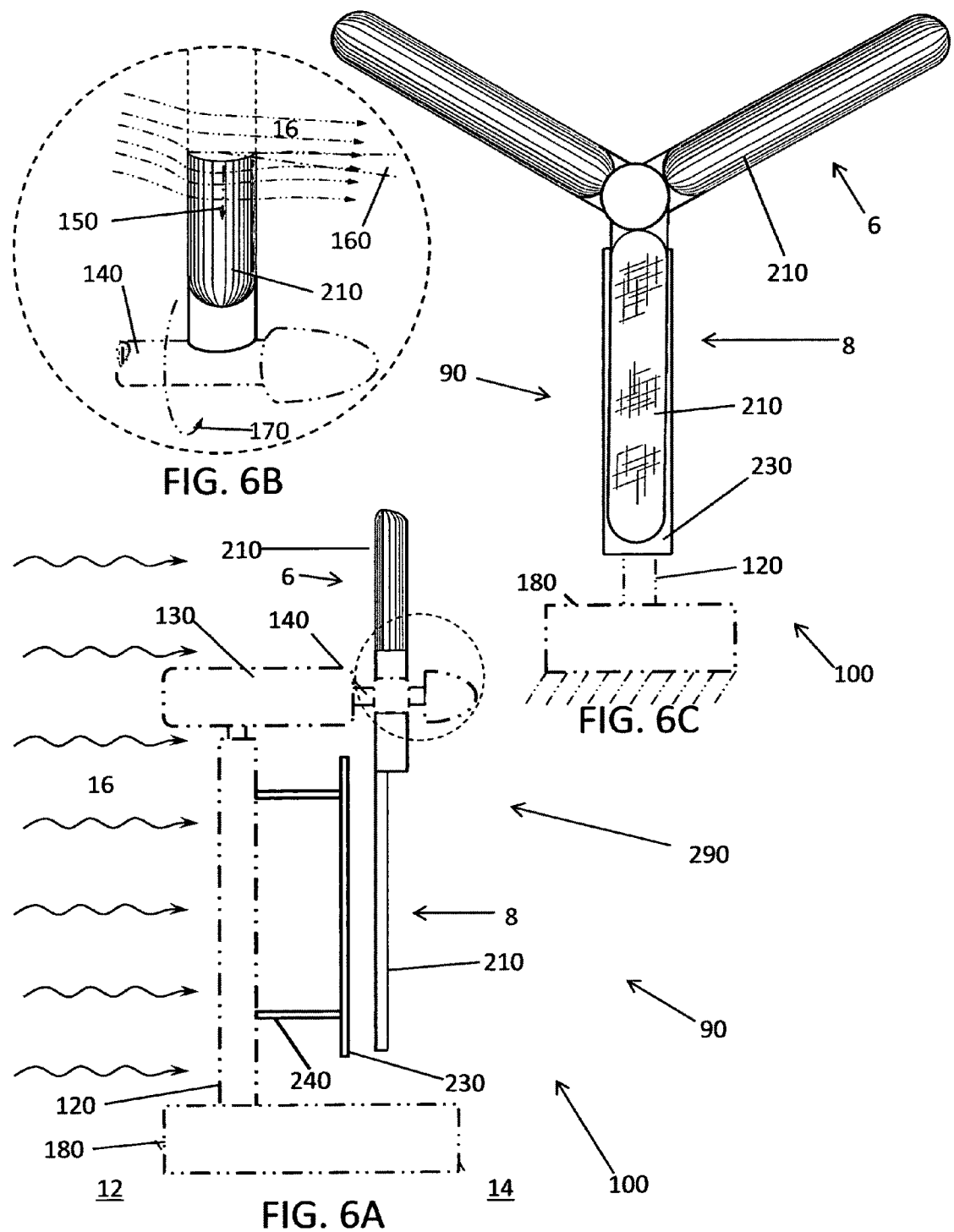

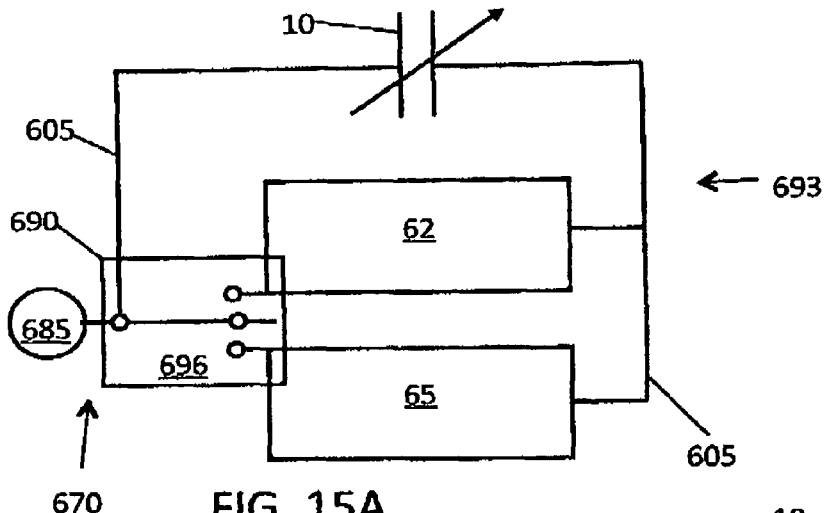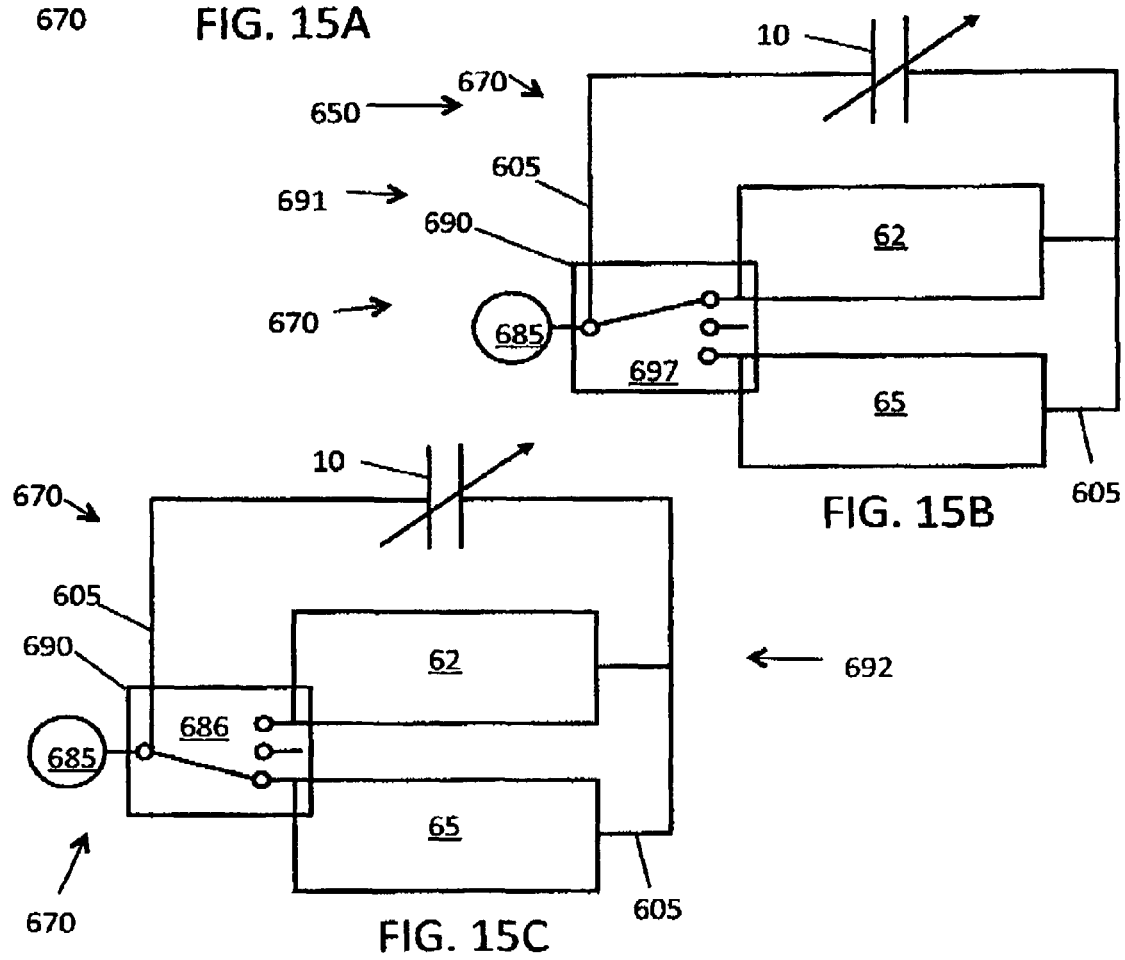

MOVING FLUID ENERGY CONVERSION DEVICE

CROSS REFERENCE TO RELATED APPLICATIONS

None.

BACKGROUND

Prior Art

The Following is a tabulation of prior art that appear to be relevant:

| U.S Patents | | | |
|---|---|---|---|
| U.S. Pat. No. | Kind Code | Issue Date | Patentee |
| 7,557,456 | A | 2009 Jul. 07 | Kornbluh |
| 7,508,085 | A | 2009 Mar. 24 | Martineau |
| 7,391,123 | A | 2008 Jul. 24 | Rome |
| 7,368,862 | A | 2008 May 06 | Pelrine |
| 7,049,732 | A | 2006 May 23 | Pei |
| 7,034,432 | A | 2006 Apr. 25 | Pelrine |
| 6,982,497 | A | 2006 Jan. 03 | Rome |
| 6,940,211 | A | 2005 Sep. 06 | Pelrine |
| 6,768,246 | A | 2004 Jul. 27 | Pelrine |

| Foreign Patent Documents | | | |
|---|---|---|---|
| Publication Nr. | Cntry Code | Bubl. Date | Applicant |
| 2009144427 | FR | 2008 Dec. 03 | RENAULT |
| 2010077923 | JP | 2010 Apr. 08 | HYPER DRIVE |

| Non Patent Literature Documents |
|---|
| 20% Wind Energy by 2030, U.S Department of Energy, July 2008 |

Moving fluid contains energy. Examples of moving fluid containing energy are, but not limited to, wind, river current, tide current and conduit current. Wind is moving air. River current is moving water in a river. Tide current is the moving water in bodies of water caused by tidal forces from the moon. These tidal forces cause water movement in and out of bays and other water bodies connected to the ocean and lakes. Conduit current includes fluid that moves through flow conduits, including but not limited to, pipes, sluices and canals.

Turbines are devices that can be used extract mechanical energy in moving fluid and convert that mechanical energy to rotational energy that is manifest by a mechanical torque that causes a shaft to rotate. The mechanical torque can be used to power electrical generators for generating electricity. Types of turbines used for harvesting moving fluid energy include, but not limited to, lift based turbines and drag based turbines. Lift based turbines deliver the mechanical torque from lift forces from one or more lift bodies. These forces are generated by moving fluid over the one or more lift bodies affixed to a rotating shaft. The one or more lift forces are generated in a direction that produces torque around the rotating shaft. Drag based turbines deliver mechanical torque from one or more drag forces, produced by the moving fluid over one or more drag bodies affixed to a rotating shaft. The one or more drag forces are generated in a direction that produces torque around the rotating shaft. The turbine produced torque can be used to generate electricity using conventional electrical generators.

Turbines are complex machines that are expensive to manufacture, operate and maintain. The amount of energy turbines can extract is limited by their size. As turbines become larger, the more complex and expensive they become. In addition, a mechanical coupling between the turbine and the generator is required for generating electricity. The mechanical coupling and the generator are also complex and expensive to manufacture, operate and maintain. Devices and methods that can increase the energy harvested from moving fluid turbines would be beneficial.

Electroactive polymer generators also provide a means for converting mechanical energy to electrical energy. Generating electrical energy using electroactive polymer generators is disclosed in U.S. Pat. Nos. 7,557,456, 7,368,862, 7,049, 732, 7,034,432, 6,940,211 and 6,812,624. Thermal energy to electrical energy conversion using electroactive polymer generators is disclosed in U.S. Pat. No. 6,628,040. Use of electroactive polymer generators for conversion of deflection mechanical energy, in backpacks, to electrical energy is disclosed in U.S. Pat. Nos. 7,508,085, 7,391,123 and 6,982,497. A means for converting biologically generated mechanical energy into electrical energy is disclosed in U.S. Pat. No. 6,768,246. In this application, electroactive polymer generators are positioned in the heels of footwear so that deflections are imparted to the generators. The deflections result from forces imparted to the footwear heels from the heels striking the walking surface. A means for converting tire deflection energy in automobile wheels, using electroactive polymer generators, is disclosed in U.S. Pat. No. 7,508,085. U.S. Pat. No. 7,557,456 and International Patent JP2010077923 describe systems and methods that use electroactive polymer generators to convert wave mechanical energy to electrical energy. International Patent WO 2009144427 discloses a means for converting vibrations mechanical energy, from transportation vehicles, to electrical energy using electroactive polymer generators.

The above electroactive polymer generator devices convert energy from mechanical deflections to electrical energy. Electroactive polymer generator devices and methods that convert deflections caused by the energy in moving fluid to electrical energy would be beneficial.

SUMMARY

In accordance with one embodiment an electroactive polymer generator can be employed as part of a moving fluid energy conversion device for converting mechanical energy in moving fluid to electrical energy. The moving fluid energy conversion device includes an electroactive polymer generator comprising one or more transducers, conditioning electronics, and a charge exchange means.

In one aspect, the one or more transducers, of the moving fluid energy conversion devices are fixed to a structure that holds the one or more transducers so a moving fluid impinges the one or more transducers. The moving fluid impingement transfers mechanical energy to the one or more transducers, causing the one or more transducers to stretch from a relaxed state a stretched state. In addition, the structure holds the one or more transducers so that a solid body blocks the moving fluid from impinging the one or more transducers and causing the one or more transducers return to the relaxed state. The one or more transducers are configured to produce electrical energy as the one or more transducers move to the relaxed state from the stretched state.

In another aspect, the one or more transducers, of the moving fluid energy conversion devices are attached to a stationary structure with components that move. The moving components translate the one of more transducers. The moving components of the stationary structure provides a means for positioning the one or more transducers for impingement by the moving fluid. The moving fluid impingement transfers mechanical energy to the transducer, causing the transducer to stretch from a relaxed state a stretched state. In addition, the moving component translate the stretched one or more transducers to align with a solid body that removes the moving fluid impingement, causing the one or more transducers return to the relaxed state. The one or more transducers are configured to produce electrical energy as the one or more transducers returns to the relaxed state from the stretched state In yet another aspect, the one or more transducers are affixed to a moving structure that positions the transducer so the moving fluid impinges the one or more transducers. The moving fluid impingement causes the one or more transducers to stretch from a relaxed state to a stretched state, transferring the mechanical energy to the one or more the transducers. After the one or more transducers reach the stretched state, the moving structure positions the one or transducers so that moving fluid impingement changes, causing the one or more transducers to return to the relaxed state from the stretched state. The one or more transducers are configured to produce electrical energy as the one or more transducers returns to the relaxed state from the stretched state.

In still another aspect, the one or more transducers are affixed adjacent to a surface that is used to for transporting movable bodies. The one or more transducers are affixed to the surface in a position where the one or more transducers are impinged by a moving fluid causing the one or more transducers to deflect from a relaxed state to a stretched state. At a later time a movable body is transported to a position that blocks the moving fluid impingement on the one or more transducers causing the one or more transducers to return to the relaxed state. The one or more transducer are configured to produce electrical energy as the one or more transducers return to the relaxed state from the stretched state In yet another aspect, a method is provided for generating electrical energy from energy in moving fluid using an electroactive polymer generator. The method includes stretching one or more transducers, of the electroactive polymer generator, to a stretched state and relaxing the one or more electroactive transduces to a relaxed state. The method also includes recovering electrical energy as the one or more transducer returns to the relaxed state from the stretched state.

Advantages

Accordingly, several advantages of one or more aspects are as follows: to increase the energy output from moving fluid turbines; to convert energy in a moving fluid directly to electrical energy using simple inexpensive electroactive polymer generators; to generate electrical energy without expensive complex machinery and without an expensive and complex torque transfer mechanical devices. Other advantages of one or more aspects will be apparent from a consideration of the drawings and ensuing description.

DRAWINGS

Figures

FIG. 1A describes a two-step a method for converting mechanical energy contained in the moving fluid to electrical energy.

FIG. 2A shows a stretched transducer for the moving fluid energy conversion device.

FIG. 2B shows a relaxed transducer for the moving fluid energy conversion device.

FIG. 4A shows a side view of a lift based moving fluid turbine with an energy conversion device relaxed transducer.

FIG. 4B shows a lift body affixed to the rotating shaft.

FIG. 4C shows a front view of the lift based moving fluid turbine with an energy conversion device relaxed transducer.

FIG. 6A shows a side view of the moving fluid lift based turbine with an energy conversion device with lift body transducers.

FIG. 6B shows a lift body transducer affixed to the rotating shaft.

FIG. 6C shows a front view of the moving fluid lift based turbines with an energy conversion device with lift body transducers.

FIG. 15A through FIG. 15C show a velocity based charge exchange means circuit diagrams.

Figure 1A:
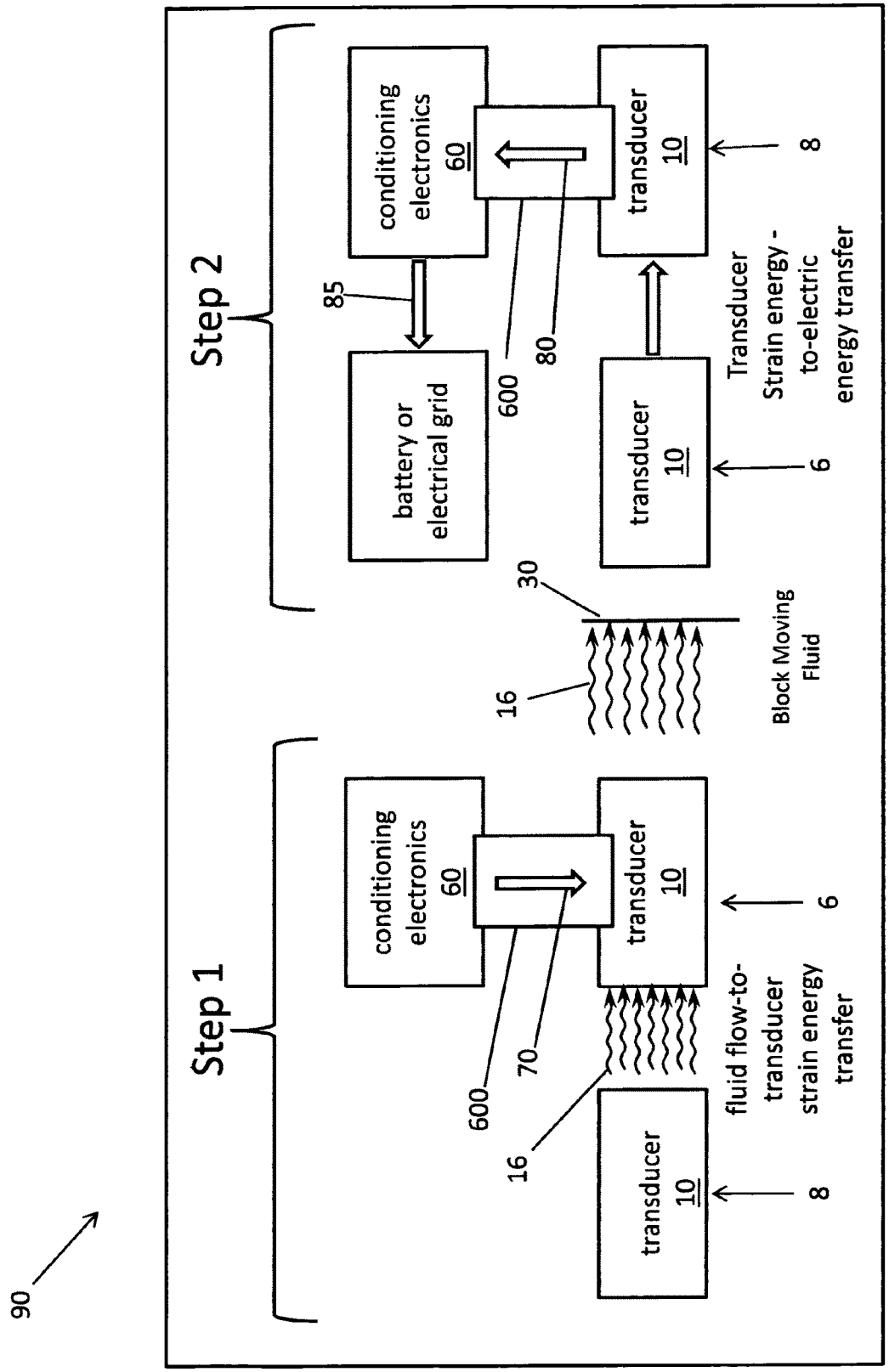
FIG. 1B shows a block diagram for the method that converts the energy in the moving fluid to electrical energy.

| DRAWINGS-REFERENCE NUMERALS | | | |
| --- | --- | --- | --- |
| 2 | frame | 4 | transducer diaphragm |
| 6 | stretched state | 8 | relaxed state |
| 10 | transducer | 12 | upstream side |
| 14 | downstream side | 16 | moving fluid |
| 18 | rigid fix | 20 | rotated position |
| 22 | free stream velocity | 24 | free stream pressure |
| 26 | impingement velocity | 28 | impingement pressure |
| 30 | solid body | 60 | conditioning electronics |
| 62 | charge element | 65 | recovery element |
| 70 | low voltage charge | 74 | constant voltage power supply |

-continued

DRAWINGS-REFERENCE NUMERALS

| 75 | input electrical energy | 77 | Input voltge |
|---|---|---|---|
| 78 | output voltage | 80 | high voltage charge |
| 85 | output electrical energy | 86 | electric transmission device |
| 87 | electric energy storage device | 90 | moving fluid energy conversion device |
| 100 | lift based moving fluid turbine | 110 | lift body |
| 120 | tower | 130 | nacelle |
| 140 | rotating shaft | 150 | force |
| 160 | angle of attack | 170 | torque |
| 180 | base | 190 | upstream configuration |
| 210 | lift body transducer | 230 | fluid deflector |
| 240 | deflector support | 290 | downstream configuration |
| 300 | drag based wind turbine | 310 | drag body |
| 320 | housing | 330 | connecting structure |
| 400 | stationary transducer | 405 | stationary support |
| 410 | moving solid body | 420 | surface |
| 502 | polymer spacer | 504 | top electrode |
| 506 | bottom electrode | 508 | orthogonal direction (1) |
| 510 | orthogonal direction (2) | 511 | orthogonal direction (3) |
| 600 | charge exchange means | 605 | electrical conduit |
| 610 | position based charge exchange means | 620 | transducer side contact |
| 622 | base cylinder | 624 | segmented cylinder |
| 626 | insulating cylinder | 627 | conducting elements |
| 628 | electrical insulation | 630 | generator side contact |
| 632 | brush base | 634 | brush assembly |
| 650 | charge circuit | 660 | recovery circuit |
| 670 | velocity based charge exchange means | 685 | speed measuring device |
| 686 | recovery position | 690 | three position switch |
| 691 | charge state | 692 | recovery state |
| 693 | neutral state | 696 | neutral position |
| 697 | charge position | 700 | moving element |
| 710 | moving element speed | | |

P'

DETAILED DESCRIPTION OF EMBODIMENTS

The following detailed description of the present invention is provided with respect to a few preferred embodiments. This description provides a thorough understanding of the present invention through discussion of specific details of these preferred embodiments. To those skilled in the current art, it will be apparent that the present invention can be practiced with variations to the preferred embodiments, with or without some or all of these specific details. Well known processes, steps, and/or elements have not been described in order to focus on, and not obscure, those elements of the present invention.

Introduction

This disclosure describes a moving fluid energy conversion device used for converting energy contained in moving fluid to electrical energy. The electroactive polymer generators of the moving fluid energy conversion device comprise one or more transducers and conditioning electronics. The one or more transducers are an active means for converting the energy in the moving fluid to electrical energy. Converting the energy contained in the moving fluid to electrical energy is electricity generation. Electricity generation by the one or more transducers occurs in a two stage process. The first stage begins with impingement of a moving fluid on the one or more transducers. The impingement deforms the one or more transducers from a relaxed state to a stretched state. In the stretched state, a lower voltage electrical charge is transferred to the one or more transducers. The lower voltage charge is imparted to the one or more transducers by the conditioning electronics through a charge exchange means. The first stage ends when the lower voltage electrical charge is transferred to the stretched transducer. The second stage begins with the removal of the flowing fluid impingement. Removal of the flow impingement allows the transducer to return to the relaxed state. Return of the one or more transducers to the relaxed state transforms the lower voltage charge to a higher voltage charge. The higher voltage charge is then removed from the one or more transducers in the relaxed state and constitutes the electricity generation. The conditioning electronics receive the of the higher voltage charge, through the charge exchange means, from the one or more transducers and transforms the higher voltage charge to a voltage that can be used for productive work.

To generate electricity from moving fluid using a moving fluid energy conversion device requires a method and means to impinge an electroactive polymer transducer with a moving fluid in order to deform a transducer from a relaxed state to a stretched state. After the transducer is stretch and an electric charge added, a method and means for removing the moving fluid impingement and allow the charged transducer to return to the relaxed state is required. The embodiments of moving fluid turbines and electroactive polymer generators described below can be used as the methods and means is to generate electricity.

Figure 1B:
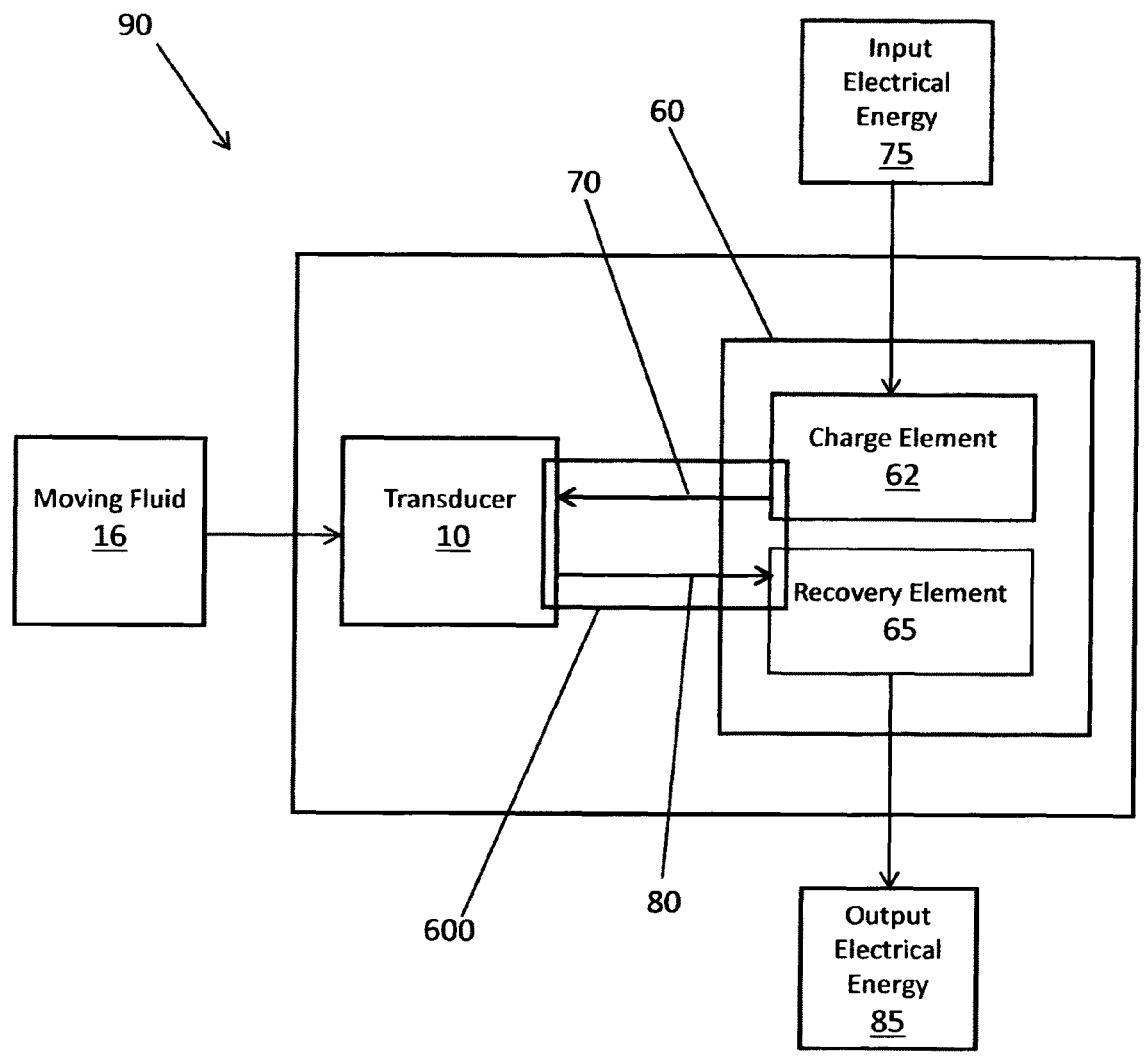

Moving Fluid Energy to Electrical Energy Conversion Method FIG. 1A and FIG. 1B

FIG. 1A shows a two-step method for a moving fluid energy conversion device 90 to convert mechanical energy contained in a moving fluid 16 to electrical energy. The moving fluid energy conversion device 90 comprises one or more transducers 10 and condition electronics 60. The method described below is for illustrative purposes only. There are other methods that could be used, and the method described herein is only one of the possible methods.

In the first step, the transducer 10 in a relaxed state 8 is impinged by the moving fluid 16. The impingement of transducer 10 by moving fluid 16 causes energy to be transferred from moving fluid 16 to transducer 10 by stretching transducer 10 from relaxed state 8 to a stretched state 6. The transducer 10 stores the energy in the form of strain energy by straining the material comprising transducer 10. When transducer 10 is in stretched state 6, a low voltage charge 70 is transferred from conditioning electronics 60 to transducer 10 by charge exchange means 600.

Step 2 starts after low voltage charge 70 is transferred to transducer 10. After low voltage charge 70 is transferred to transducer 10, moving fluid 16 is blocked from impinging transducer 10. The moving fluid 10 is blocked by solid body 30. Blocking impingement of moving fluid 16 causes transducer 10 to return to relaxed state 8 and transfers the strain energy to the electrical energy by transforming low voltage charge 70 to a high voltage charge 80. The high voltage charge 80 is then transferred to conditioning electronics 60 by charge exchange means 600.

The transfer of high voltage charge 80 to conditioning 60 electronics completes the method for converting energy contain in moving fluid 16 to electrical energy in the form of high voltage charge 80. The high voltage charge 80 is transformed to output electrical energy 85 in a usable from by conditioning electronics 60. The usable from of the electricity output electrical energy 85 is typically in the form of a lower voltage that can be stored in conventional batteries or transferred to an electrical grid.

FIG. 1B shows a block diagram for the method to convert the energy in moving fluid 16 to electrical energy. Energy inputs to the moving fluid energy conversion device 90 can include but are not limited to energy from moving fluid 16 and input electrical energy 75. The output from the moving fluid energy conversion device 90 is the output electrical energy 85. The output electrical energy 85 is greater than input electrical energy 75 because moving fluid energy conversion device 90 converts the energy in moving fluid 16 to electrical energy combined with input electrical energy 75, transforming the energy to output energy 85.

The impinging moving fluid 16 transfers energy and stretches transducer 10. The low voltage electric charge 70 is transferred by a charge exchange means 600 from conditioning electronics 60 charge element 62 to transducer 10. The charge element 62 transforms input electrical energy 75 to the voltage required for low voltage charge 70. Moving fluid 16 impingement is removed from transducer 10. The transducer 10 relaxes, transforming low voltage charge 70 to high voltage charge 80. The high voltage charge 80 is transferred from transducer 10 by charge transfer means 600 to recovery element 65 of conditioning electronics 60. The recovery element 65 transforms high voltage charge 80 from the high voltage to the voltage required for output electrical energy 85.

The method described above represents one embodiment for using electroactive polymer generators to transform energy contained in the moving fluid to electrical energy. This embodiment is one of many possible embodiments and should not be consider as inclusive of all embodiments.

Blocked and Unblocked Moving Fluid and Transducer States, FIG. 2A and FIG. 2B

FIG. 2A and FIG. 2B describes an embodiment of the moving fluid energy conversion device 90 for generating electricity. The transducer 10 is impinged by moving fluid 16. The moving fluid 16 is subsequently blocked from impinging transducer 10. The method described above and depicted in FIG. 1 is applicable to transduce 10 in this embodiment. The transducer 10 is in stretched state 6 and subsequently returns to relaxed state 8. The low voltage charge 70 can be transferred from conditioning electronics 60 to transducer 10 in stretched state 6. The high voltage charge 80 can subsequently be transferred from transducer 10 in relaxed state 8 to conditioning electronics 60.

FIG. 2A shows transducer 10 in stretched state 6. The transducer 10 comprises a frame 2, and a transducer diaphragm 4. The frame 2 maintains the shape of transducer diaphragm 4. Transducer 10 is held in a position with rigid fixes 18. The shape of transducer 10 shown is one representative shape. Other transducer embodiments may include other shapes including square, rectangular, triangular, and oval. Other shapes are possible and are not limited to the shape shown and described. There is an upstream side 12 of transducer 10 and a downstream side 14 of transducer 10. The moving fluid 16 flows from upstream side 12 to downstream side 14. The moving fluid 16 has a free stream velocity 22 and a free stream pressure 24. When moving fluid 16 impinges transducer 10 on upstream side 12, moving fluid 16 slows down from free stream velocity 22 to impingement velocity 26 and the pressure increase from free stream pressure 22 to impingement pressure 28. The pressure of moving fluid 16 on the downstream side 14 of transducer 10 is the same as free stream pressure 24. The Impingement pressure 28 causes transducer diaphragm 4 to deform to stretched state 6, in the downstream side 14 direction.

FIG. 2B shows transducer 10 in relaxed state 8. The Transducer 10 is in the relaxed state because a solid body 30 is placed on upstream side 12 of transducer 10. Placing solid body 30 on upstream side 12 of transducer 10 prevents moving fluid 16, from impinging transducer 10 and causes the pressure on upstream side 12 and downstream side 14 to be the same as free stream pressure 24. And transducer 10 returns to relaxed state 8.

Figure 3A:
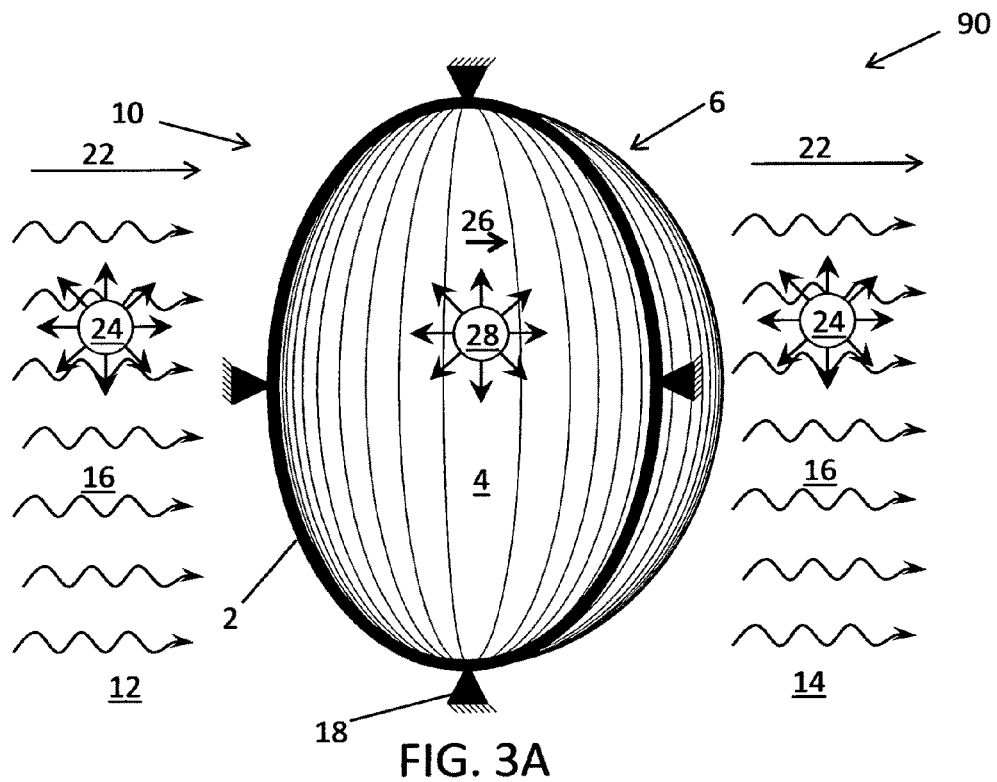
FIG. 3A shows a stretched transducer.
Figure 3B:
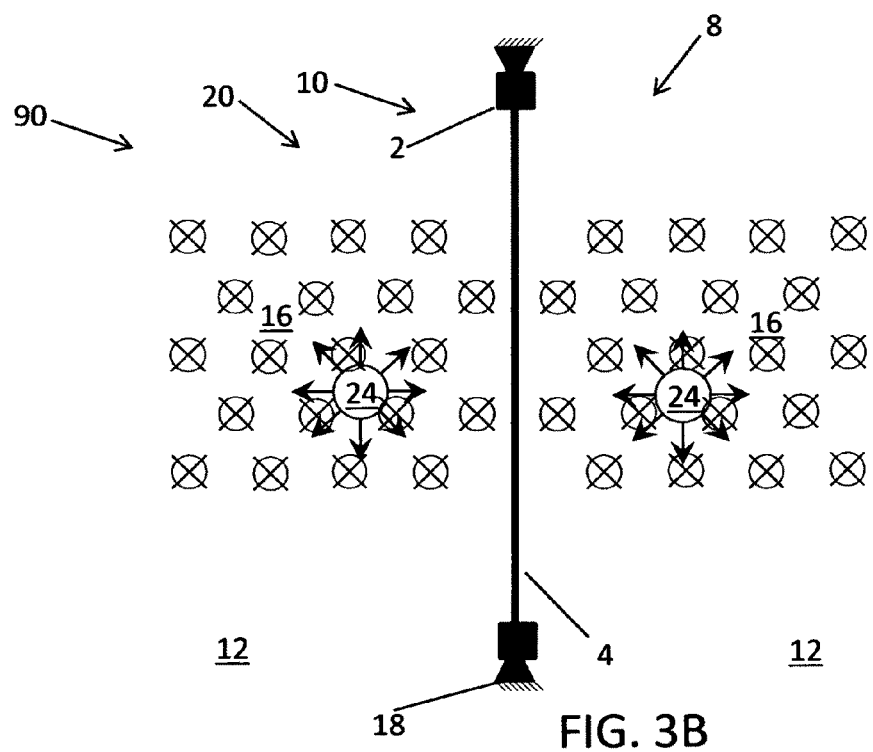
FIG. 3B shows a relaxed transducer turned to a rotated position.

Moving Fluid and Transducer States in a Rotated Position, FIG. 3A and FIG. 3B

FIG. 3A and FIG. 3B describes an embodiment where transducer 10, of moving fluid energy conversion device 90, is impinged by moving fluid 16. The transducer is subsequently turned to a rotated position 20 where moving fluid 16 is flowing parallel to transducer 10 the transducer 10 returns to relaxed state 8. The method described and depicted in FIG. 1 is applicable to transducer 10 in this embodiment. The transducer 10 is in stretched state 6 in and subsequently returns to relaxed state 8 in rotated position 20. The low voltage charge 70 can be transferred from conditioning electronics 60 to transducer 10 in the stretched state 6. The high voltage charge 80 can subsequently be transferred from transducer 10 in relaxed state 8 to conditioning electronics 60.

FIG. 3A shows transducer 10 in stretched state 6. The moving fluid 16 flows from upstream side 12 to downstream side 14. The moving fluid 16 has a free stream velocity 22 and a free stream pressure 24. When moving fluid 16 impinges transducer 10 on upstream side 12, moving fluid 16 slows down from free stream velocity 22 to impingement velocity 26 and the pressure increases from free stream pressure 24 to impingement pressure 28. The pressure of moving fluid 16 on downstream side 14 is the same as free stream pressure 24. The Impingement pressure 28 causes transducer diaphragm 4 to deform, in the direction of downstream side 14, to stretched state 6.

FIG. 3B shows transducer 10 turned to rotated position 20. The transducer 10 is aligned parallel to moving fluid 16. The transducer 10 is in relaxed state 8 because in rotated position 20 the pressure around transducer 10 is uniform and is free stream pressure 24.

Moving Fluid Lift Based Turbine with Transducer, FIG. 4A-FIG. 5B

Moving fluid energy conversion devices 90 can be used to increase the energy output of moving fluid turbines. FIG. 4A through FIG. 5B describes one embodiment where moving fluid energy conversion device 90 can be used to increase the energy output of a moving fluid turbine 100.

The method described and depicted in FIG. 1A and FIG. 1B is applicable to the embodiment shown in FIG. 4A through FIG. 5C. The transducer 10 is in stretched state 6 and subsequently returns to relaxed state 8. The low voltage charge 70 can be transferred from conditioning electronics 60 to transducer 10 in stretched state 6. The high voltage charge 80 can subsequently be transferred from transducer 10 in relaxed state 8 to conditioning electronics 60.

Figures 5A, 5B:
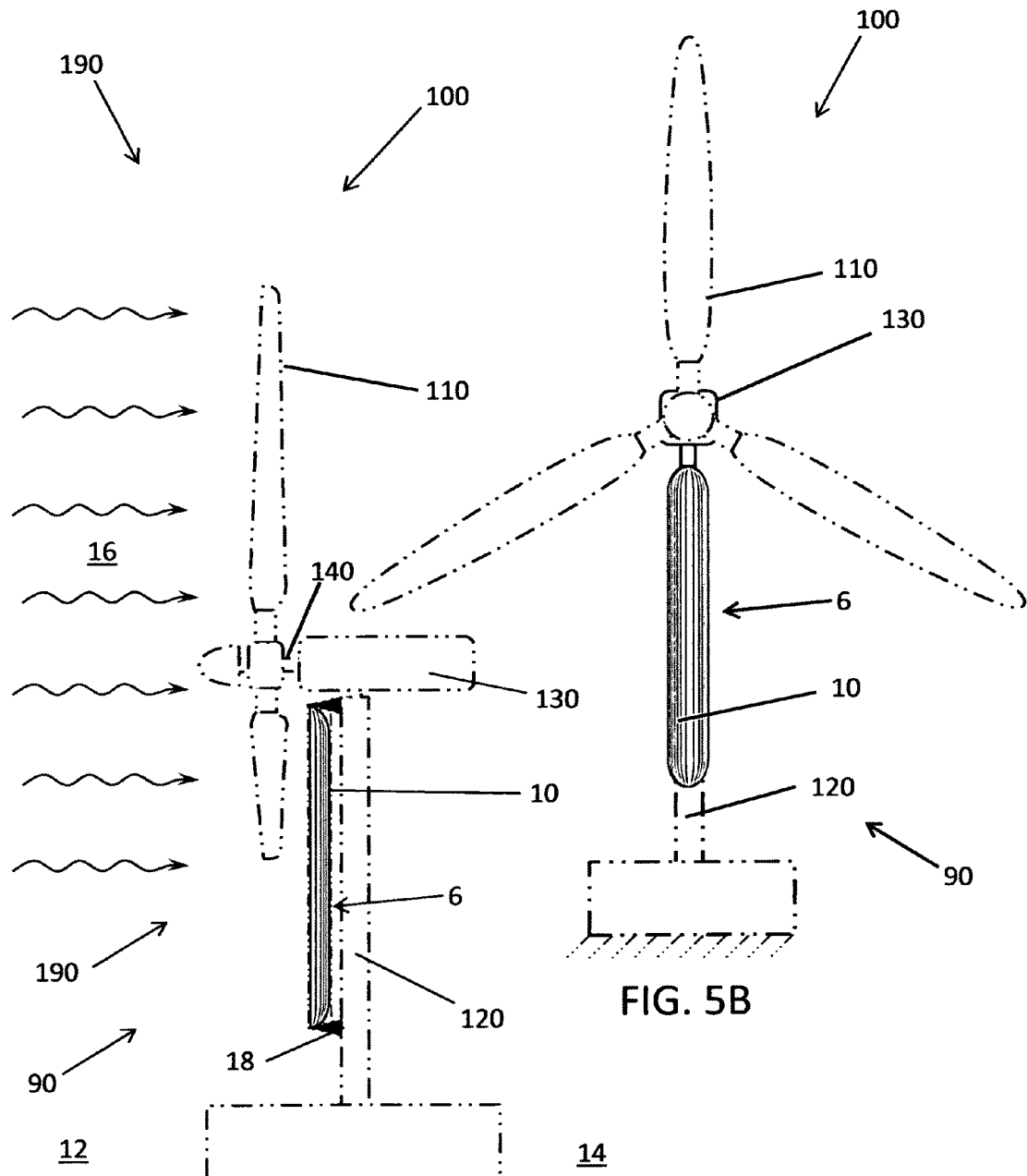
FIG. 5A shows a side view of the lift based moving fluid turbine with an energy conversion device stretched transducer.
FIG. 5B shows a front view of the lift based moving fluid turbine with an energy conversion device stretched transducer.

FIG. 4A shows a side view of the lift based moving fluid turbine 100 where an embodiment of moving fluid energy conversion device 90 is used to produce electricity that can be adding to the electrical output of the turbine 100. The lift based moving fluid turbine 100 comprises one or more lift bodies 110, a rotating shaft 140 that one or more lift bodies 110 are attached, a nacelle 130, a tower 120, and a base 180. The lift based moving fluid turbine 100 is shown in an upstream configuration 190. In upstream configuration 190, one or more lift bodies 110 are positioned on upstream side 12 of tower 120. The nacelle 130 contains machinery and equipment that may include an electrical generator within it. The nacelle 130 is connected to tower 120. The tower 120 supports an assembly that includes one or more lift bodies 110, shaft 140 and nacelle 130. The base 180 supports and affixes turbine 100 in place. A transducer 10 in relaxed state 8 is affixed to tower 120 with rigid fixes 18. Moving fluid 16 impinges one or more lift bodies 110. FIG. 5A shows moving fluid turbine 100 where one of the lift bodies 110 prevents moving fluid 16 from impinging transducer 10 and transducer 10 is in relaxed state 8.

FIG. 4B shows lift body 110 affixed to rotating shaft 140. Moving fluid 16 is impinging and flowing over lift body 110. The lift body 110 is positioned at an angle of attack 160 relative to the flow direction of moving fluid 16. Impingement of moving fluid 16 on lift body 110 at angle of attack 160 causes moving fluid 16 to impart a force 150 to lift body 110 and produces a torque 170 around rotating shaft 140. The torque 170 causes shaft 140 to rotate. Rotation of shaft 140 causes the one or more lift bodies 110 to change position relative to tower 120.

FIG. 4C shows a front view lift based moving fluid turbine 100. One lift body 110 is positioned over transducer 10. The lift body 110 covers transducer 10 and prevents impingement by moving fluid 16.

FIG. 5A shows a side view of lift based moving fluid turbine 100 with transducer 10 impinged by moving fluid 16. The lift based moving fluid turbine 100 is shown in an upstream configuration 190. Transducer 10 is in stretched state 6, where stretched state 6 is caused by moving fluid 16 impingement on the transducer 10.

FIG. 5B shows a front view the turbine 100. The one of or more lift bodies 110 are positioned so that the moving fluid 16 to impinges the transducer 10.

Lift Based Moving Fluid Turbines with Lift Body Transducers, FIG. 6A-FIG. 6C

Another embodiment, described in FIG. 6A through FIG. 6C, where moving fluid energy conversion device 90 is used to generate electricity and increase the energy output from moving fluid turbines. The method described and depicted in FIG. 1A and FIG. 1B is applicable to the embodiment shown in FIG. 6A through FIG. 6C. The transducer 10 is in stretched state 6 and subsequently returns to relaxed state 8. The low voltage charge 70 can be transferred from conditioning electronics 60 to transducer 10 in stretched state 6. The high voltage charge 80 can subsequently be transferred from transducer 10 in relaxed state 8 to conditioning electronics 60.

FIG. 6A shows a side view of a moving fluid lift based turbine 100 with one or more lift body transducers 210. The lift based turbine 100 shown in downstream configuration 290. In downstream configuration 290 one or more lift body transducer 210 is positioned on downstream side 14 of tower 120. The one or more lift body transducers 210 are attached to rotating shaft 140. Moving fluid deflector 230 is positioned on downstream sided 14 of tower 120. Attachment of moving fluid deflector 230 is attached to tower 120 by one or more deflector supports 240. The lift body transducers 210 are configured to function as the lift forced generating means, in addition to transducers 10. The lift body transducers 210 are attached to shaft 140.

FIG. 6B shows lift body transducer 210 affixed to rotating shaft 140 at angle of attack 160. Lift body transducer 210 impingement by moving fluid 16 causes lift body transducer 210 to stretch from relaxed state 8 to stretched state 6. The lift body transducer 210 in stretched state 6 at angle of attack 160 generates force 150 that produces torque 170 and rotates shaft 140. Rotation of shaft 140 causes the one or more lift body transducer 210 to change position relative to tower 120.

FIG. 6C shows a front view of moving fluid lift based turbines 100 with the one or more lift body transducers 210. One lift body transducer 210 is aligned with the moving fluid deflector 230. The alignment of lift body transducer 210 with moving fluid deflector 230 removes moving fluid 16 impingement from lift body transducer 210 causing lift body transducer 210 to return to relaxed state 8. The lift transducers 210 not aligned with moving fluid deflector 230 remains in their stretched states 6 and continue to generate lift force 150 that produces torque 170.

Figure 7A:
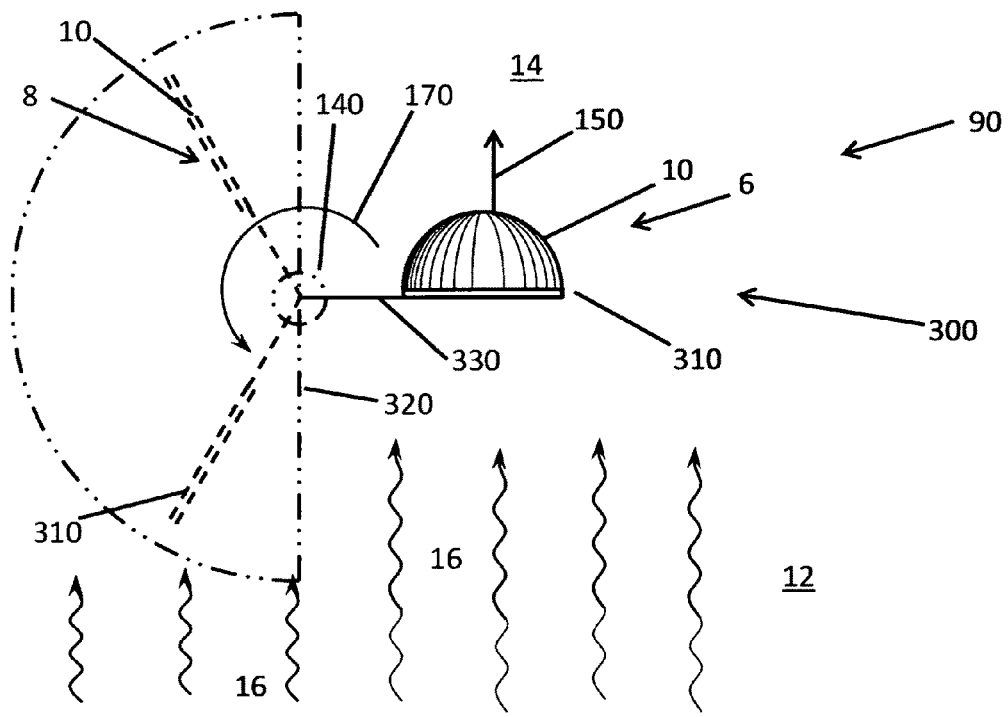
FIG. 7A shows a top view of a moving fluid drag based turbine with the moving fluid energy conversion device.
Figure 7B:
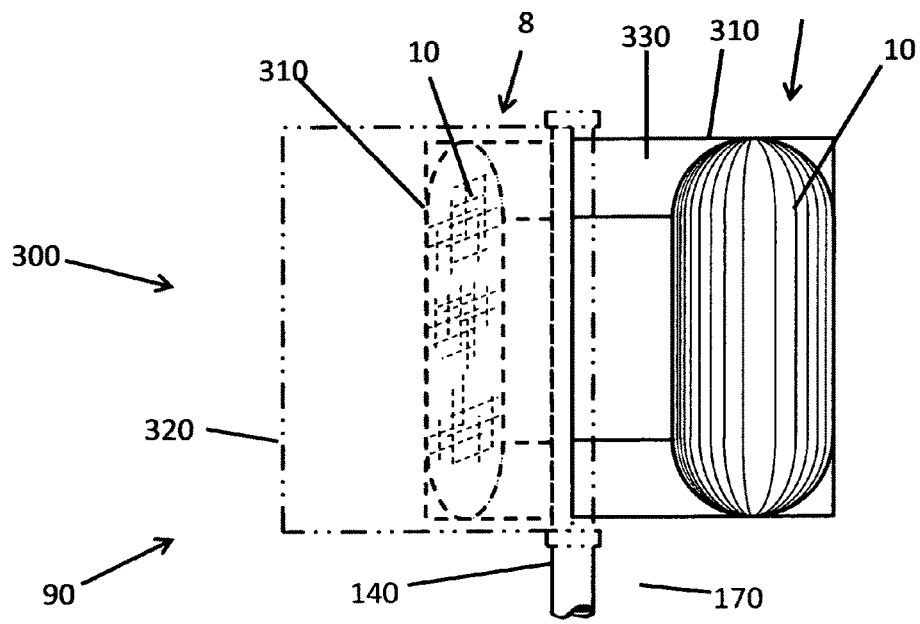
FIG. 7B shows a front view of a moving fluid drag based turbine with the moving fluid energy conversion device.

Drag Based Moving Fluid Turbine with Transducer FIGS. 7A & 7B

Still another embodiment that can be used to extract energy from moving fluid using moving fluid energy conversion device 90 with a drag based moving fluid turbine to generate electricity is shown in FIG. 7A and FIG. 7B and described below.

The method described and depicted in FIG. 1A and FIG. 1B is applicable to the embodiment shown in FIG. 7A through FIG. 7C. The transducer 10 is in the stretched state 6 and subsequently returns to the relaxed state 8. The low voltage charge 70 can be transferred from conditioning electronics 60 to transducer 10 in stretched state 6. The high voltage charge 80 can subsequently be transferred from transducer 10 in the relaxed state 8 to conditioning electronics 60.

FIG. 7A shows a top view of a drag based moving fluid turbine 300. The drag based moving fluid turbine 300 comprises one or more drag bodies 310, a housing 320 and a rotating shaft 140. The one or more drag bodies 310 comprise at least one transducer 10 and a connecting structure 330. The connecting structure 330 attaches drag body 310 to shaft 140.

The transduces 10, on the one or more drag bodies 310 positioned inside the housing 320 are in relaxed state 8. The transducers are in relaxed state 8 because the fluid inside of the housing is stationary. As a result the pressure on all sides of transducers 10 inside the housing 10 is equal. The one or more drag bodies 310 positioned outside the housing 320 is impinged by moving fluid 16. Impingement of the one or more drag bodies 310 by moving fluid 16 produces force 150 that produces torque 170 around rotating shaft 140. The rotation of shaft 140 causes movement of one or more drag bodies 310 from a position inside the housing 320 to a position outside of the housing 320.

FIG. 7B shows a front view of drag based moving fluid turbine 300. The one or more drag bodies 310 positioned outside of housing 320 is impinged by moving fluid 16. The impingement of transducer 10 by moving fluid 16 stretches transducer 10 to stretched state 6. When the one or more drag bodies 310 are positioned inside the housing 320, transducers 10 are in relaxed state 8.

Stationary Transducers FIG. 8A-8D

In yet another embodiment, shown in FIG. 8A through FIG. 8D, moving fluid conversion device 90 with a stationary transducer 400 can be used to recover the energy contained in moving fluid to for conversion to electrical energy. In this embodiment, stationary transducer 400 is positioned so that it is impinged by the moving fluid 16. The stationary transducer 400 comprises transducer 10 and a support structure 405 that is rigidly fixed to a surface 420 that can be used for moving solid bodies 410 over. Subsequently, a movable solid body 410 moves into a position that blocks moving fluid 16 from impinging transducer 10. The movable solid body 410 can be but not limited to a truck, a car, a ship, or any other body that moves over a surface. The method described and depicted in FIG. 1A and FIG. 1B is applicable to the embodiment shown in FIG. 8A through FIG. 8D, where transducer 10 is in stretched state 6 and subsequently returns to relaxed state 8. The low voltage charge 70 can be transferred from conditioning electronics 60 to transducer 10 in stretched state 6. The high voltage charge 80 can subsequently be transferred from transducer 10 in the relaxed state 8 to conditioning electronics 60.

Figure 8A:
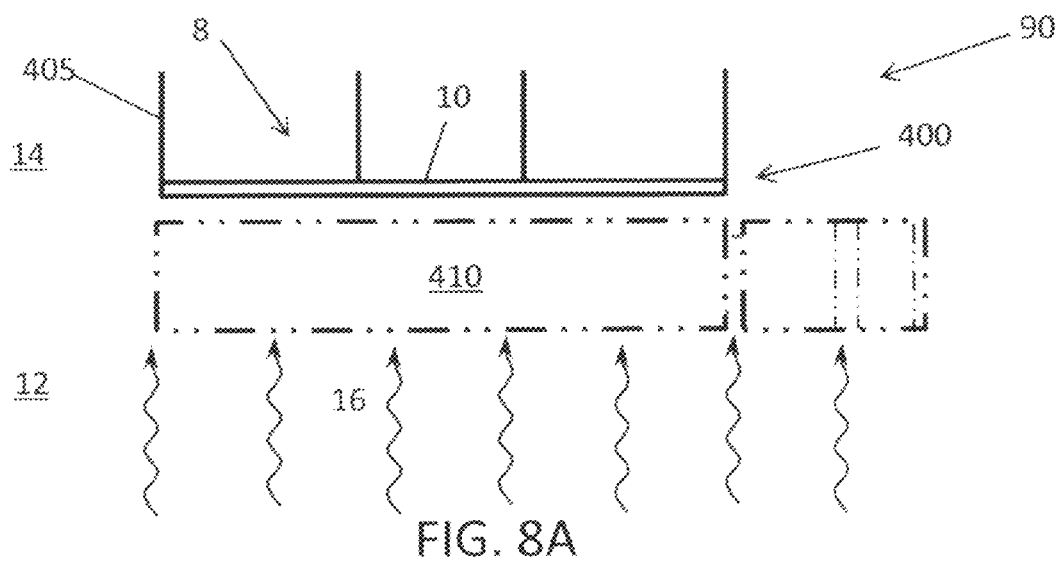
FIG. 8A-8D shows the moving fluid energy conversion device with a stationary transducer.
Figure 8B:
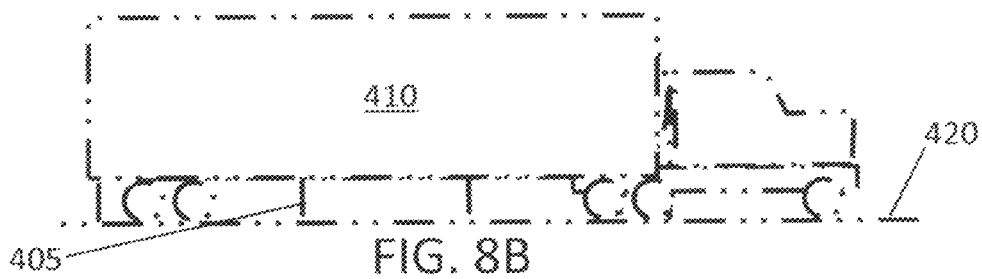

In the embodiment shown in FIG. 8A and FIG. 8B stationary transducers 400 is fixed to surface 420 by support 405.

FIG. 8A shows a top view of moveable solid body 410 that is positioned on upstream side 12 of transducer 10 of stationary transducer 400. The position of movable solid body 410 blocks impingement of transducer 10 by moving fluid 16. FIG. 8B shows a side view of movable solid body 410 positioned on upstream side 12 of transducer 10. The transducer 10 is blocked from view because movable body 410 blocks the view of transducer 10, in the same way impingement of by moving fluid 16 is blocked. In this embodiment movable solid body 410 is a tractor trailer truck. Many other vehicles could be movable solid bodies 410 and are not limited to that shown in FIG. 8B. The Transducer 10 is in relaxed state 8 because movable solid body 410 is blocking impingement of transducer 10 by moving fluid 16.

Figure 8C:
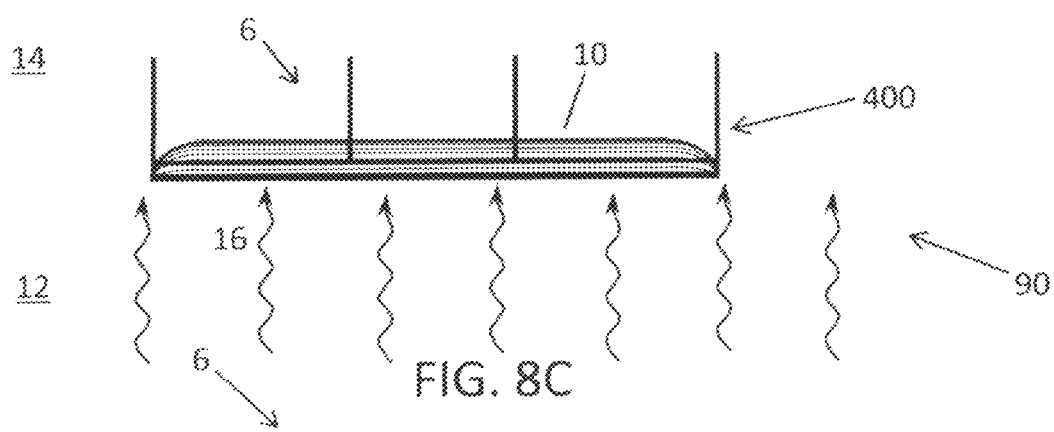
Figure 8D:
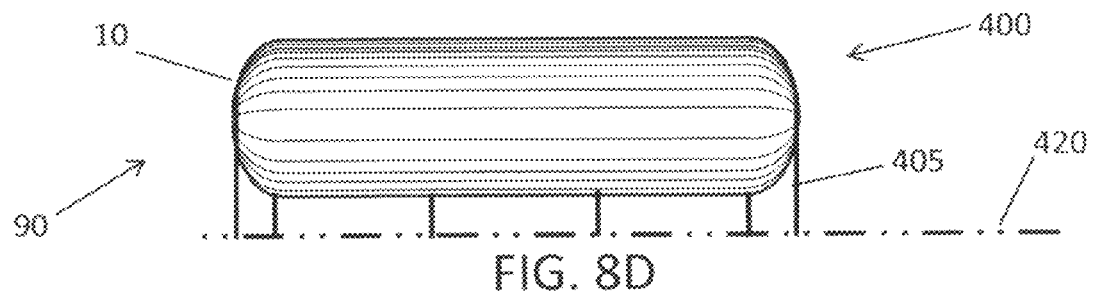

FIGS. 8C and 8D shows a top view and a front view respectively of transducer 10. The transducer 10 is impinged by moving fluid 16. The impingement of transducer 10 is caused by moving movable solid body 410 out of the position on upstream side 12 of transducer 10. The transducer 10 is in stretched state 6 because of the impingement of moving fluid 16.

At a later time, another or the same movable solid body 410 blocks the impingement of transducer 10 by moving fluid 16. The movable body 410 can block transducer 16 at regular intervals of time or at intermittent time intervals.

Figure 9A:
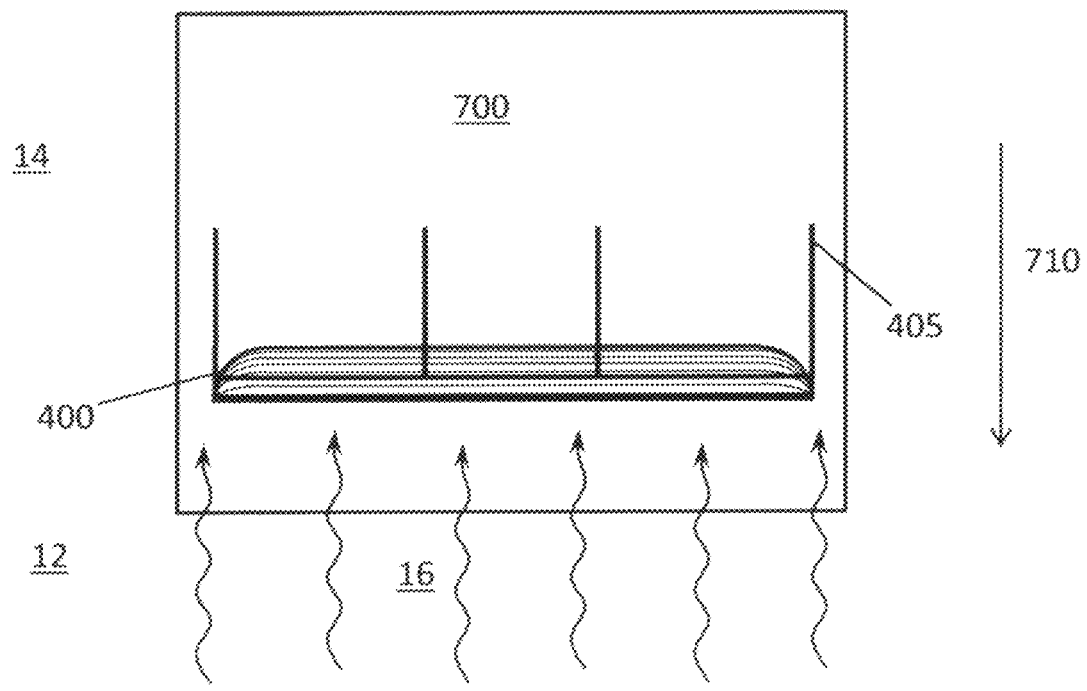
FIG. 9A and FIG. 9B shows a moving fluid energy conversion devices affixed to a moving element
Figure 9B:
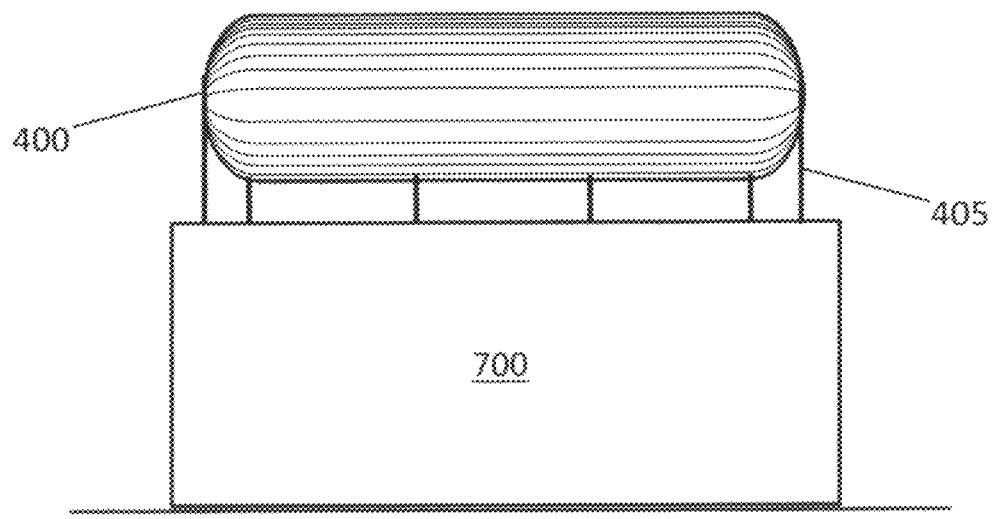

Stationary Transducers Affixed to a Moving Element FIGS. 9A and 9B

In yet another embodiment, shown in FIG. 9A and FIG. 9B, moving fluid conversion device 90 with a stationary transducer 400 is affixed to moving element 700 in an aspect causing moving fluid impingement on transducer 400. The method described and depicted in FIG. 1A and FIG. 1B is applicable to the embodiment shown in FIG. 9A and FIG. 9B, where transducer 10 is in stretched state 6 and subsequently returns to relaxed state 8. The low voltage charge 70 can be transferred from conditioning electronics 60 to transducer 10 in stretched state 6. The high voltage charge 80 can subsequently be transferred from transducer 10 in the relaxed state 8 to conditioning electronics 60.

In the embodiment shown in FIG. 9A and FIG. 9B, stationary transducer 400 is fixed to moving element 700 wherein moving element 700 traverses through a fluid at moving element speed 710. The traversing of moving element 700 through the fluid at moving element speed 710 causes the fluid to move relative to moving element 700 and impinges stationary transduce 400 in the same aspect as moving fluid 16 impinges stationary transducer 400 affixed to surface 420. The speed of moving fluid 16 is the same as moving element speed 710 by in a direction that is opposite to that of moving element 700.

Figure 10:
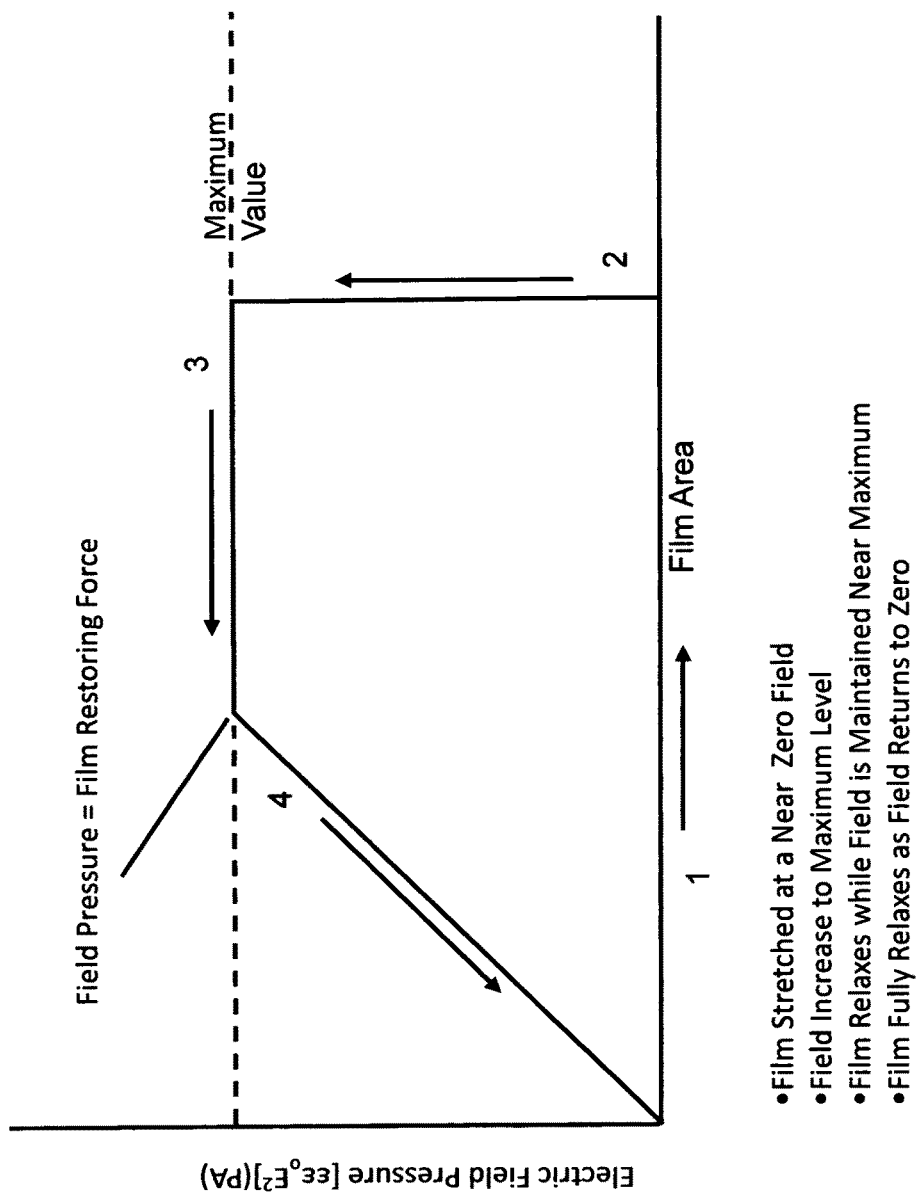
FIG. 10 shows an energy recovery cycle for the moving fluid energy conversion device

Energy Recovery Cycle—FIG. 10

The moving fluid energy conversion device 90 proceeds through an energy recovery cycle to generate electricity. The energy recovery cycle is shown in FIG. 10. This cycle is shown for illustrative purposes only. Many different cycles could be employed for the present invention.

A representative energy recovery cycle is comprised of four segments. In Segment 1 an electroactive polymer film contains low electric field pressure and a mechanical force pulls the film to a stretched configuration. In Segment 2, electric charge is transferred to the film increasing the electric field pressure on the film to a maximum value. In Segment 3 the film is relaxed, to where the restoring force of the stretched film equals the external force from the electrical field pressure. The electric field pressure remains near its maximum value. As the electroactive polymer film relaxes, the electrical energy on the film increases because the electroactive polymer film restoring force returns the film to its original thickness. The electrical energy increase is manifest in the form of a voltage increase. The increase in the charge's energy is harvested in the form of electric current flow. In Segment 4 the electroactive polymer film fully relaxes as the electric field pressure is reduced to near zero and all of the electrical energy is recovered.

Figure 11A:
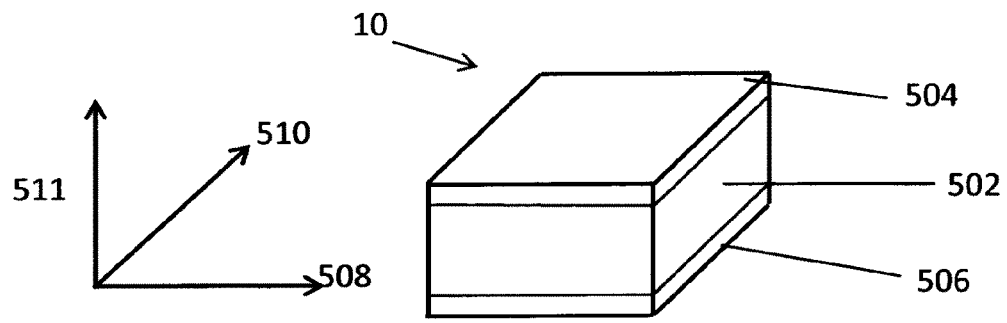
FIGS. 11A and 11B shows the moving fluid energy conversion device transducer in relaxed and stretched states.
Figure 11B:
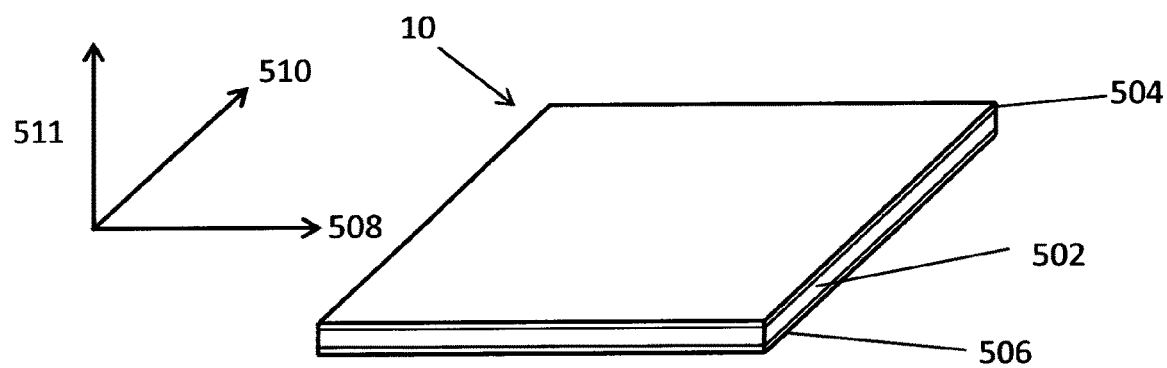
Figure 11C:
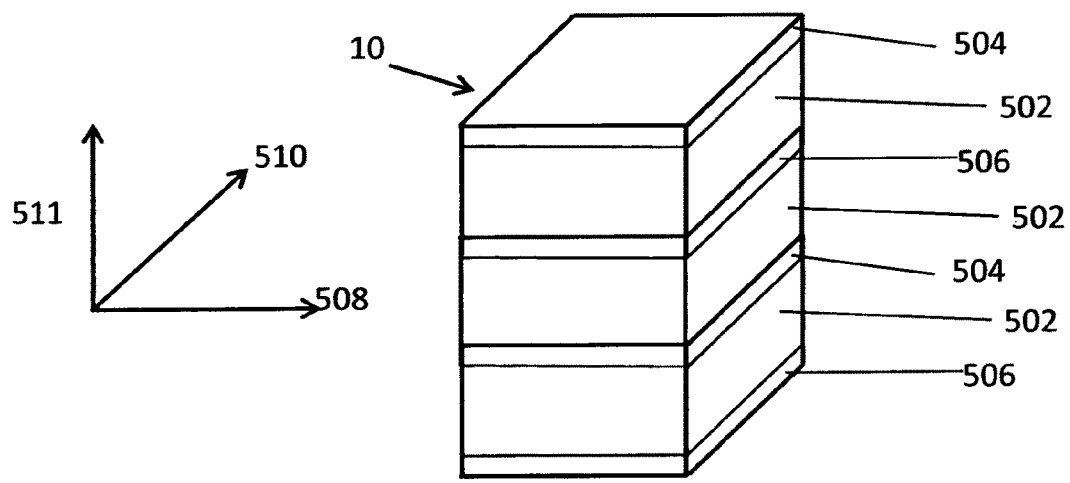
FIG. 11C show a moving fluid energy conversion device transducer with multiple transducer layers.

Electroactive Polymer Transducers—FIG. 11A, FIG. 11B and FIG. 11C

FIG. 11A shows the transducer 10 in relaxed state 8. FIG. 11B shows the transducer 10 in the stretched state 6. The Transducer 10 is comprised of a top electrode 504, a bottom electrode 506 and a polymer spacer 502. The polymer spacer 502 is placed between top electrode 504 and bottom electrode 506. Top electrode 504 and bottom electrode 506 are affixed to polymer spacer 502. Polymer spacer 502 is an elastomeric material that is an electrical insulator with dielectric properties, Top electrode 504, and bottom electrode 506 are comprised of elastomeric electrically conductive materials or a conductive grease.

FIG. 11C shows alternating layers of the top electrode 504, followed by a polymer layer 502, followed by bottom electrode 506, followed by a spacer 502, followed by a top electrode 504 and continuing. The alternating layers form multiple transducer layers. The transducer 10 can comprise a single transducer layer or multiple layers.

Transducer 10 functions as a variable capacitor. A capacitor is defined as two conducting electrodes separated by a dielectric, electrically insulating medium. One of the electrodes corresponds to top electrode 504. The other electrode corresponds to bottom electrode 506. The dielectric, electrically insulating medium corresponds to polymer spacer 502. The capacitance C of a parallel plate capacitor can be described as $C = \in^° k A/T$. Where $\in^°$ is the electrical permittivity constant, k is the dielectric constant of the nonconducting medium, A is the area of the capacitor and T is the thickness of the nonconducting medium. The capacitance of a capacitor is proportional to the electrode surface area divided by the distance between the electrodes. Placement of a dielectric material between the electrodes increases the capacitance. Increasing the electrode surface area and reducing the distance between the electrodes increases the capacitance. Conversely, reducing the electrode surface area and increasing the distance between the electrodes reduces the capacitance.

FIG. 11A and FIG. 11B show a means by which transducer 10 converts mechanical energy to electrical energy. FIG. 5A shows transducer 10 in relaxed configuration. In FIG. 11B, transducer 10 is mechanically stretched by external forces to a larger area in a plane defined by 508 and 510 and thinner in the direction defined 511. An electric charge is applied to electrodes 504 and 506 of transducer 500 in the stretched configuration. The applied charge results in a voltage difference between electrodes 504 and 506.

The resulting electrostatic force is insufficient to balance the elastic restoring forces of the stretch stretched polymer. As the external force is released, transducer 10 contracts to a smaller planar area in directions 508 and 510 and becomes thicker in direction 511 as shown in FIG. 11A. Reducing the planar area in directions 508 and 510 and increasing the distance between electrodes 504 and 506 reduces the capacitance and as a result, raises the electrical energy and voltage of the charge. That is, mechanical deflection is turned into electrical energy and transducer 10 is acting as a generator.

The increase in electric energy, U, can be illustrated by $U = 0.5 Q2/C$, where Q is the amount of positive charge on the electrodes and C is the capacitance. If Q is fixed and C decreases, the electrical energy U increases The increase in electrical energy in the form of increased voltage can be recovered and stored or used. Thus, transducer 10 converts mechanical energy to electrical energy when it contracts. Some or all of the charge can be removed when transducer 10 is fully contracted. Alternately, some or all of the charge can be removed during contraction.

If the electric field pressure in the polymer increases and reaches balance with the mechanical elastic restoring force and external load during contraction, the contraction will stop before full contraction, and no further elastic mechanical energy will be converted to electrical energy. Removing some of the charge and stored electrical energy reduces the electrical filed pressure, thereby allowing contraction to continue. Thus removing some of the charge may further convert mechanical energy to electrical energy. The exact electrical behavior of transducer 10 when operating as a generator depends on any electrical and mechanical loading as well as the intrinsic properties of polymer spacer 502 and electrodes 504 and 506.

Many polymers are commercially available for use as transducer materials. The materials used in transducer applications can have linear strain capacities of at least one hundred percent. Further, some of these materials can have linear strain capacities between two hundred and four hundred percent. Linear strain is defined in this application as the deflected distance per relaxed length along the direction of applied load. The deflected distance is the difference between the stretched length and relaxed length. It is also desirable that these materials are reversible over the range of strain. In other words, it is preferred that they return to their relaxed length after the applied load is removed. Some of the materials that are currently available include: silicone elastomers, thermoplastic elastomers, acrylic elastomers, polyurethanes and fluoroelastomers. This list is not intended to cover all possible suitable transducer materials and is provided as examples to show possible materials. There are many other possible transducer materials.

Various types of electrode materials suitable for use in the present invention are described by Pelrine et al. in U.S. Pat. No. 6,768,246. Materials suitable use in an electrode for the present invention include; graphite, carbon black, thin metals such as gold and silver, gel and polymers grease suspended metals, graphite, or carbon and conductive grease.

Figure 12:
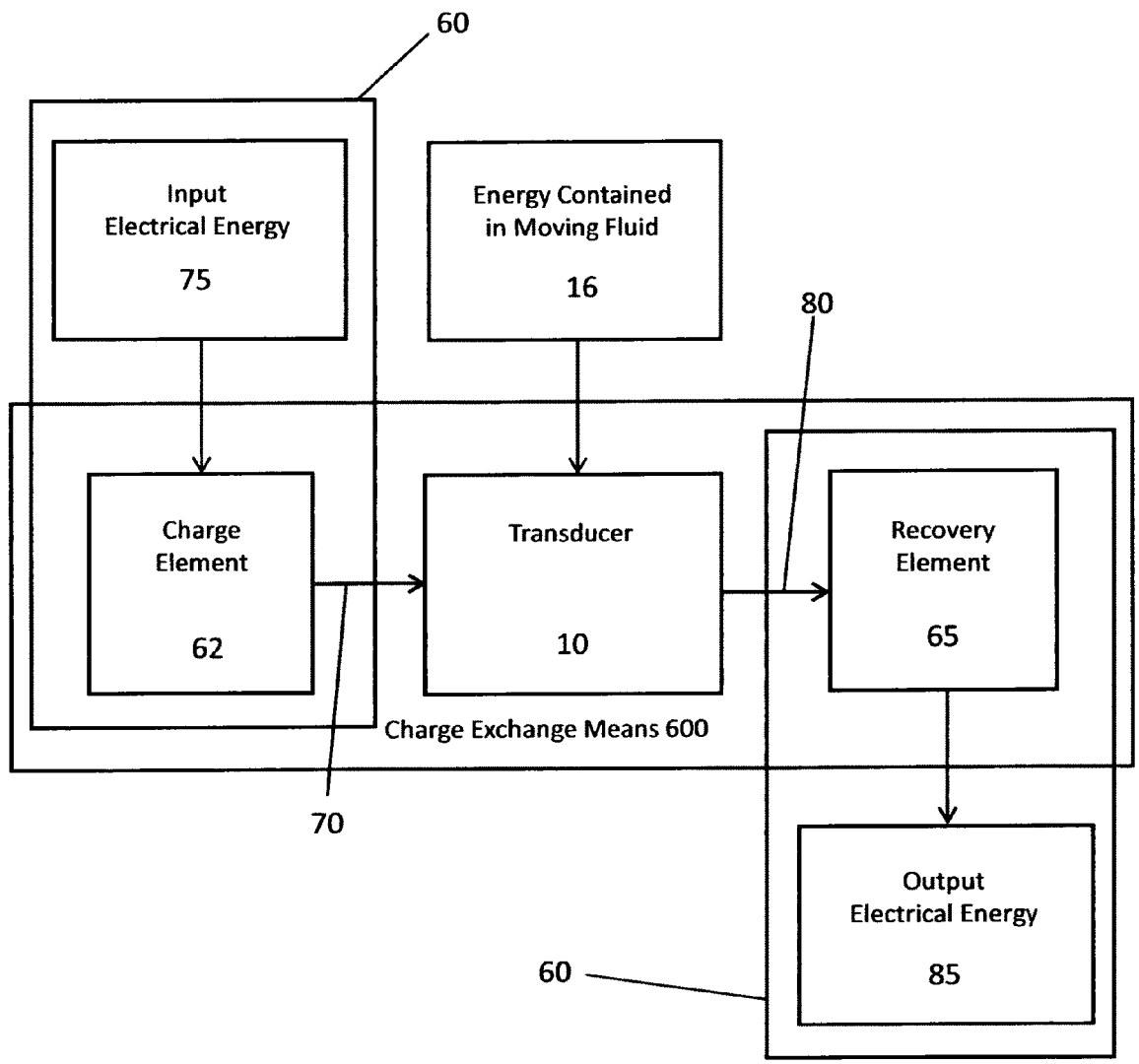
FIG. 12 shows a block diagram of a charge exchange means of the moving fluid energy conversion device.
Figure 13A:
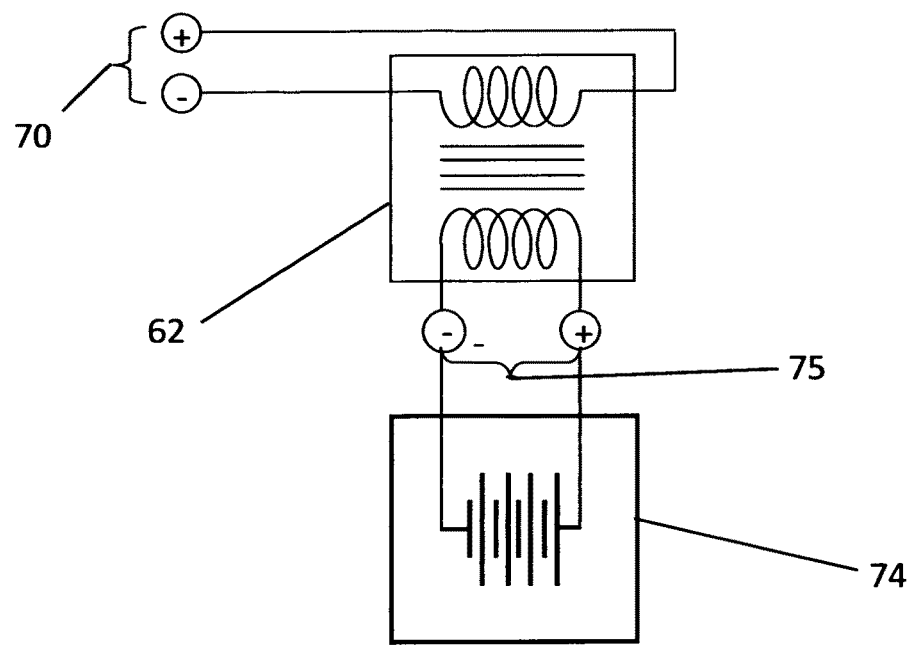
FIG. 13A and FIG. 13B show a conditioning electronics charge circuitry and recovery circuitry for the energy conversion device.
Figure 13B:
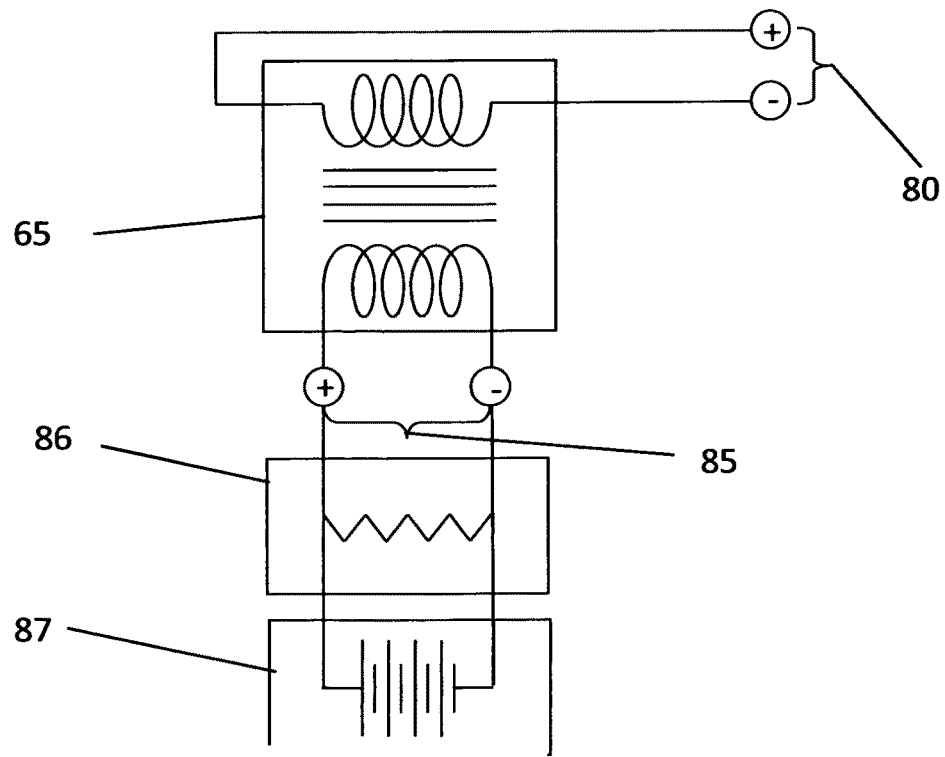

Electrical Circuits—FIG. 12 to FIG. 13B

In the present invention input electrical energy 75 and energy contained in moving fluid 16 is applied to transducer 10 in a manner that allows output electrical energy 85 to be greater than input electrical energy 75. The moving fluid 16 energy to electrical energy conversion generally requires charge exchange to and from transducer 10 to coincide with the stretched state 6 and relaxed state 8.

FIG. 12 shows a block diagram of charge exchange means 600 of moving fluid energy conversion device 90. Input electrical energy 75, in the form of low voltage charge 70, is transferred to transducer 10 in stretched state 6 through charge element 62 of conditioning electronics 60. The transducer 10 is in stretched state 6 because energy contained in moving fluid 16 is transferred to transducer 10. After addition of input electrical energy 75, transducer 10 returns to relaxed state 8. Returning transducer 10 to relaxed state 8 transforms low voltage charge 70 to high voltage charge 80. The high voltage charge 80 flows through recovery element 65. The recovery element 65 of conditioning electronics 60 converts the high voltage charge 80 to the output electrical energy 85. The charge exchange means 600 controls the flow of input electrical energy 75 through charge element 62 to transducer 10. The charge exchange means 600 also controls flow of output electrical energy 85 through recovery element 65.

The control of electrical energy flow by charge exchange means 600 can be based on the position of shaft 140 or is based on the impingement velocity 26 of moving fluid 16. If flow of low voltage charge 70 or high voltage charge 80 is dependent on the position of one or more lift bodies 110, then charge exchange means 600 is a position based charge exchange means 610. If flow of the low voltage charge 70 or the high voltage charge 80 is dependent on the moving fluid velocity 16 then charge exchange means 600 is a velocity based charge exchange means 620.

The position based charge exchange means 610 transfers low voltage electric charge 70 to transduce 10, in stretched state 6, at a time $t_1$ when the one or more turbine lift bodies 110 or one or more drag bodies 310 are positioned so that moving fluid 16 impinges transducer 10. At a later time $t_2$, position based charge exchange means 610 transfers high voltage charge 80 from transducer 10, in relaxed state 8, to conditioning electronics 60 when one or more lift bodies 110 or one or more drag bodies 310 are in a position that prevents impingement of moving fluid 16.

The velocity based charge exchange means 670 transfers the low voltage electric charge 70 to transducer 10, in stretched state 6, at time $t_1$ when free stream velocity 22 impinges transducer 10. At a later time $t_2$ velocity based charge exchange means 670 transfers high voltage charge 80 from transducer 10 in relaxed state 8 when measured impingement velocity 26 low and near zero and different that free stream velocity 22.

A charge circuit 650 is formed, at time $t_1$ when transducer 10 is in stretched state 6. The charge exchange means 600 forms charge circuit 650 by making an electrical connection between transducer 10 and charge element 62 of conditioning electronics 60.

A recovery circuit 660 is formed at time $t_2$ when transduce 10 is in relaxed state 8. The charge exchange means 600 forms recovery circuit by making an electrical connection between transducer 10 and recovery element 65 of conditioning electronics 60.

FIG. 13A shows a representative diagram for charge element 62 combined with a constant voltage power supply 74. The constant source power supply 74 provides input electrical energy 75 to charge element 62. The constant source power supply 74 can be a battery or electrical circuitry that takes input power from an electrical generator and produces input electrical energy 75. The charge element 62 can be step-up circuitry that is configured to produce low voltage charge 70 from input electrical energy 75. To achieve efficient energy recovery, low voltage charge 70 is in a range of 1000 to 4000. At these voltages, with the dielectric constants of current electroactive polymers, the relaxed thickness of polymer spacer 502 is in a range of 0.1 to 2.5 millimeters. Descriptions of representative step up circuitry can be found in U.S. Pat. Nos. 7,557,456 and 6,768,246.

FIG. 13B shows a representative diagram for recovery element 65 combined with electric transmission device 86 or electric energy storage device 87. Recovery element 65 of the present invention can be comprised of a step-down circuit. The high voltage charge 80 is reduced to the voltage for output electric energy 85 by recovery element 65. The output electric energy 85 flows to the electric energy storage device 87 or electric transmission device 86. The electric energy storage device 87 can be a battery, storage capacitor or any other device that is appropriate for storing electrical energy. The electric transmission device 86 can be any device that adds the electric energy to the electricity transmission grid. Descriptions of representative step down circuitry can be found in U.S. Pat. Nos. 7,557,456 and 6,768,246

The circuits, of the moving fluid energy conversion device 90, are not limited to those describe above. The variation of these circuits can depend on the configuration of energy conversion device 90.

To understand the operation of the moving fluid energy conversion device 90, the operational parameters at two times $t_1$ and $t_2$ can be compared. At $t_1$, transducer 10 possesses capacitance $C_1$, and input voltage 77 $V_B$. The input voltage 77, $V_B$ can be provided by the charge element 62. At a later time t2, capacitance C2 of transducer 10 is lower than capacitance C1. Generally speaking, the higher capacitance C1 occurs when the transducer 10 is in the stretched state 6, and the lower capacitance C2 occurs when transducer 10 is in the relaxed state 8. The capacitance of a capacitor can be estimated by well-known formulas relating the capacitance to the area, thickness, and dielectric constant.

Typically, the moving fluid energy conversion device 90 operates at a particular voltage, $V_O$. The output voltage 78, $V_2$ that appears on the transducer 10 at time, $t_2$ may be approximately related to charge $Q_1$ on the transducer 10 at $t_1$ as:

$$V_2 = Q_1/C_2 = C_1 V_B/C_2, \text{ where } Q_1 = Q_2$$

If it is assumed that $C_1$ is the maximum capacitance for the transducer 10, then $V_2$ is about the maximum voltage that could be produced by the moving fluid energy conversion device 90. When charge flows from transducer 10 after $t_2$, the voltage is lower than when no charge has flowed. This is because the charge flow takes charge away from transducer 10. As a result, the charge on transducer 10 would be less than $Q_1$. Thus, the voltage on transducer 10 would be reduced.

Charge removed from the moving fluid energy conversion device 90 can be calculated by assuming a constant operational voltage $V_o$ which is between $V_B$ and the maximum voltage $V_2$ of the moving fluid energy conversion device 90. The conversion device 90 of this invention is not limited to a constant $V_O$ and the example is provided for illustrative purposes only. When the operational $V_O$ voltage of the moving fluid energy conversion device 90 is assumed to be constant at the average of maximum $V_2$ and $V_B$ is:

$$V_O = \tfrac{1}{2}(V_2 - V_B) = (C_1 V_B/C_2 + V_B), \text{ where } Q_1 = Q_2$$

The charge, $Q_O$ on the transducer 10 is $$C_2 V_o = \tfrac{1}{2}(C_1 + C_2).$$

In this example, the charge, $Q_{Out}$ that passes through recovery element 65 between $t_1$ and $t_2$ is the difference between the charge at $t_1$, $Q_1$ and the charge after $t_2$, $Q_O$. This means that $Q_{out}$ may be computed as follows $$Q_{out} = Q_1 - Q_O = V_B(C_1 - C_2)/2$$

When the transducer 10 operates at a substantially constant frequency, f, the current $I_L$ delivered to the energy transmission device 86 or electric storage device 87 by the moving fluid energy conversion device 90 is, $$I_L = fQ_{Out} = fV_B(C_1 - C_2)/2$$

power $P_L$, delivered to the energy transmission device 86 or electric storage device 87, $$P_L V_O I_L = fV_O V_B (C_1 - C_2)/2$$

In the example above, the constant frequency, f is discussed for illustrative purposes only. Transducers of the present invention may operate at a constant frequency or a frequency that varies with time. Thus, the current, IL may also vary with time.

Figure 14A:
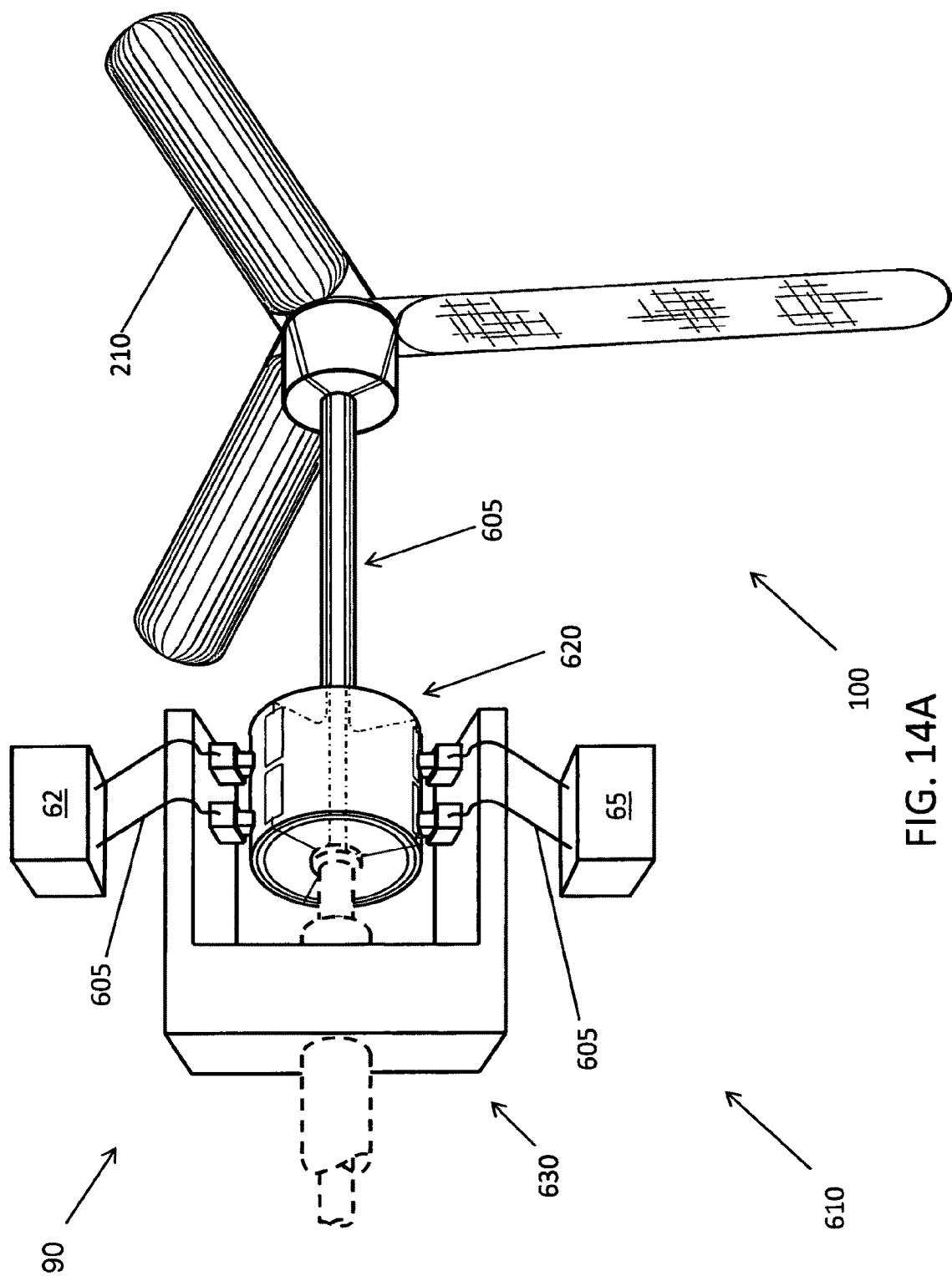
FIG. 14A and FIG. 14B show a position based charge exchange means.
Figure 14B:
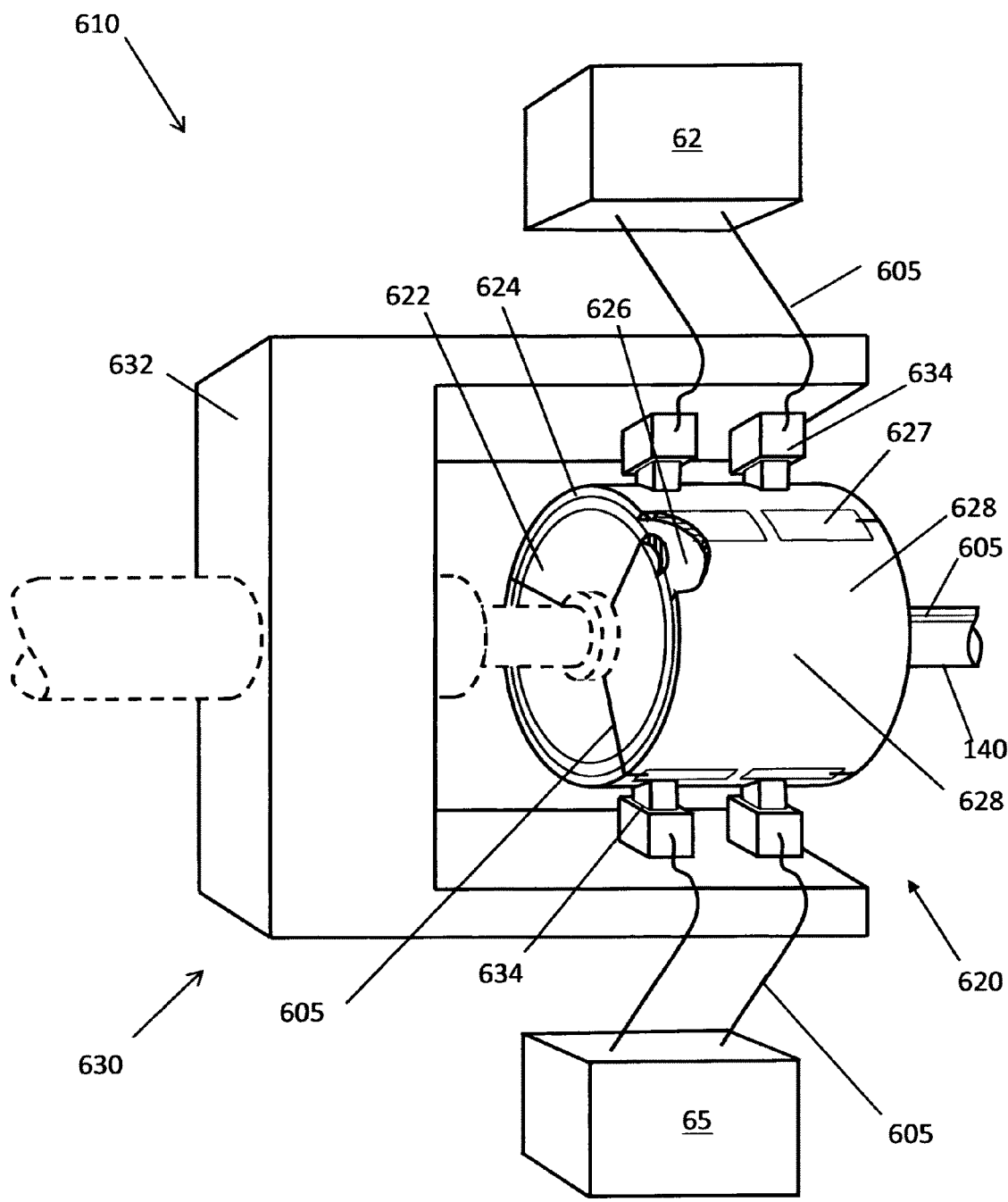

Position Based Charge Exchange Means, FIG. 14A and FIG. 14B

FIG. 14A shows the moving fluid energy conversion device 90 with position based charge exchange 610, charge element 62 and recovery element 65, affixed to lift based turbine 100 with one or more the lift body transducers 210. The position based charge exchange means 610 is comprised of transducer side contact 620, generator side contact 630 and multiple electrical conduits 605.

FIG. 14B shows details of position based charge exchange means 610. The transducer side contact 620 is comprised of segmented cylinder 624, insulating cylinder 626, and base cylinder 622. The segmented cylinder 624 is comprised of a plurality of conducting elements 627 affixed to insulating cylinder 626. The plurality of conducting elements 627 are assembled in side-by-side pairs on segmented cylinder 624. Each of the conducting elements 627 are electrically insulated from each other by surrounding electrical insulation 628. Each of the conducting element 627 pairs is electrically connected to one of the lift body transducers 210. Two or more electrical conduits 605 provide the electrical connection between the pairs of conducting elements 627 and one or more lift body transducers 210. One conducting element 627 is connected to top electrode 504 with one or more electrical conduits 605. And bottom electrode 506 is connected to the other conducting element 627 with one or more electrical conduits 605.

Generator side contact 630 is comprised of a brush base 632, two or more pairs of brush assemblies 634 and multiple electrical conduits 605. Brush assembly 634 pairs are positioned on brush base 632 so that each brush assembly 634 pair is in contact with a pair of conducting elements 627 of segmented cylinder 624. The electrical conduits 605 provide the electrical connection between the two or more brush assembly 634 pairs, charge element 62 and recovery element 65.

Figure 14C:
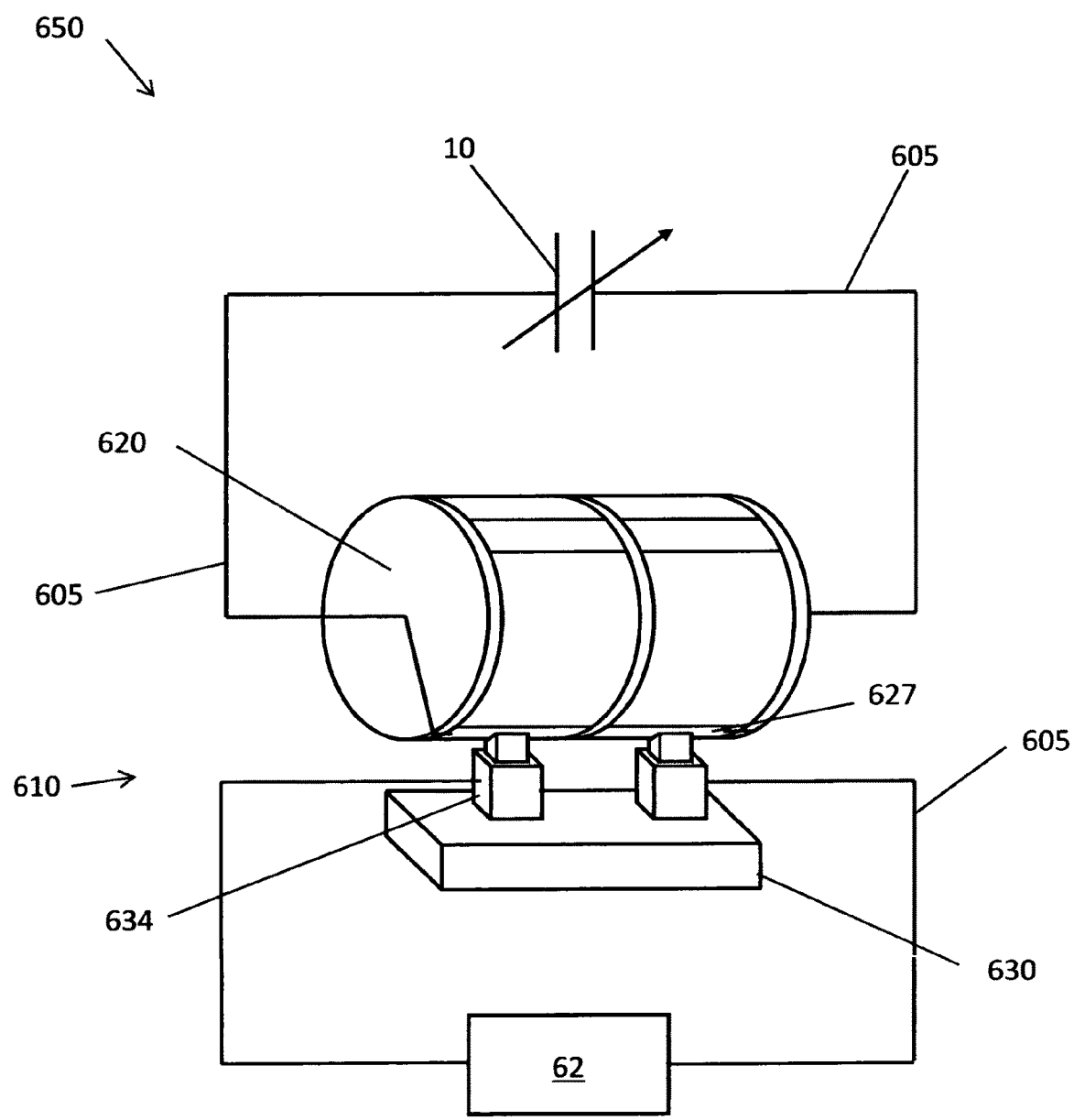
FIG. 14C and FIG. 14D show charge circuitry and recovery circuitry for the position based charge exchange means.
Figure 14D:
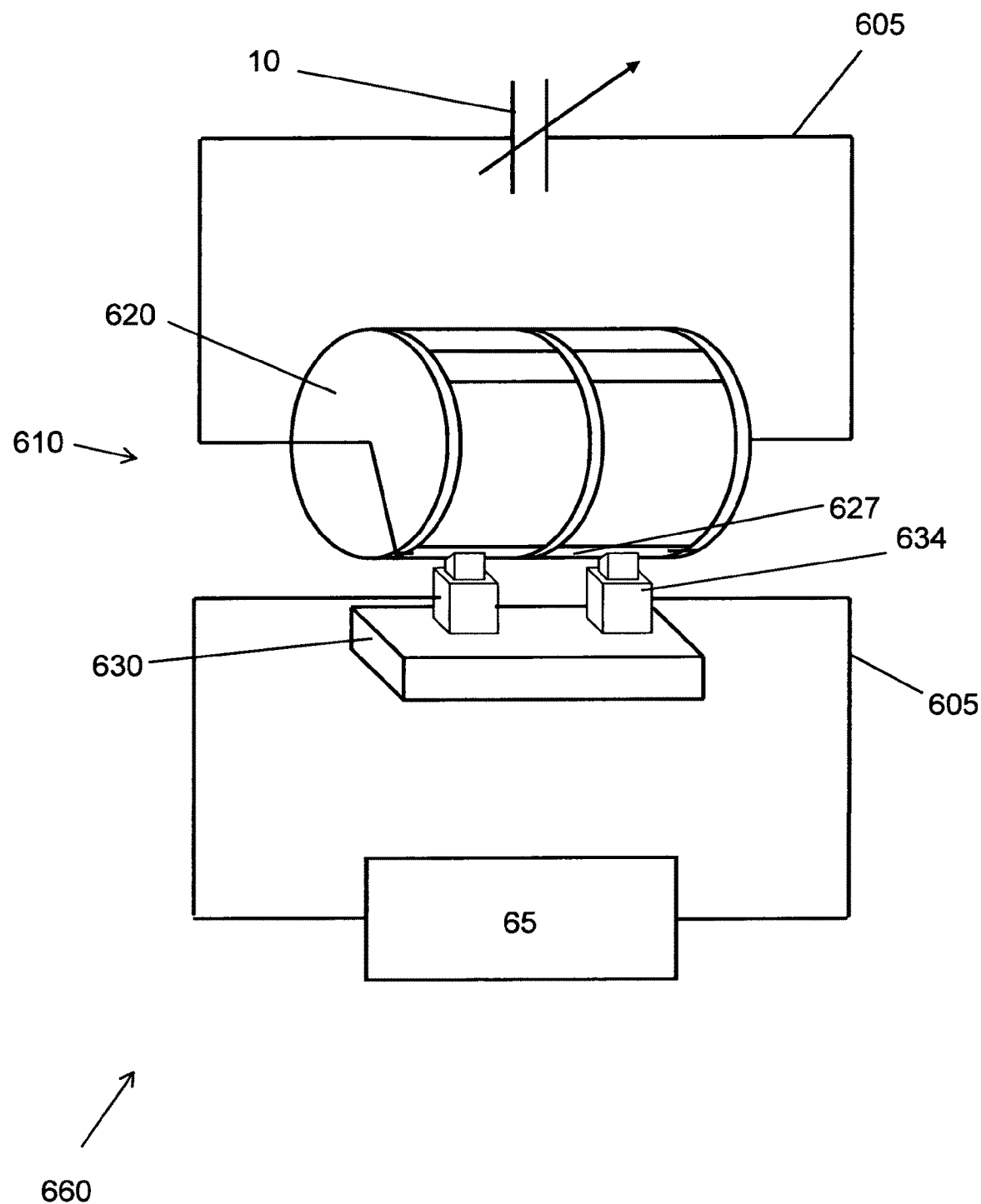

Position Based Charge Circuit and Recovery Circuit, FIG. 14C and FIG. 14D

FIG. 14C shows position based charge exchange means 610 in charge circuit 650. At least two electrical conduits 605 provide electrical connection between charge element 62 and generator side contact 630 brush assembly 634 pair. The brush assembly 634 pair provides electrical contact between generator side contact 630 and transducer side contact 620. At least two electrical conduits 605 provide electrical connection between transducer side contact 620 conducting element 627 pair and transducer 10. Use of position based charge exchange means 610 can be used for any transducer 10 configuration including lift body transducer 210 described in the current embodiment and fixed transducer 410. Formation of charge circuit causes input electrical energy 75 to flow through charge element 62 through generator side contact 630 and transducer side contact 620 to transducer 10.

The shaft 140 continues to rotate causing the transducer side contact 620 conducting element 627 pair to lose contact with generator side contact 630 brush assembly 634 pair. The input electrical energy 75 remains on transducer 10 after conducting element 627 pair to the brush assembly 634 pair contact is broken. Continued rotation of shaft 140 causes the formation of the recovery circuit 660.

FIG. 14D shows position based charge exchange means 610 in recovery circuit 660. At least two electrical conduits 605 provide the electrical connection between recovery element 65 and generator side contact 630 brush assembly 634 pair. The generator side contact 630 brush assembly 634 pair provides the electrical connection to transducer side contact 620 conducting element 627 pair. At least two electrical conduits 605 provide electrical contact between transducer side contact 620 conducting element 627 pair and the transducer 10. Formation of recovery circuit 660 causes output electrical energy 85 to flow from transducer 10 through transducer side contact 620 and generator side contact 630 to recovery element 65.

The shaft 140 continues to rotate causing transducer side contact 620 conducting element pair 627 to lose contact with generator side contact 630 brush assembly 634 pair. The transducer 10 returns to the stretched state 6 with a small electrical charge. The shaft 140 continues to rotate so that position based charge means 610 charge circuit 650 is reformed.

The electrical conduits 605 are comprised of electrically conductive materials including conductive polymers, metals, and carbon fiber. These are limited examples of materials that can be used in conduits 605 and should not be construed as a complete listing of all materials that can be used of conduits 605.

The charge transfer means configurations described above are provided for illustrations purposes only. Many other charge transfer means configurations are possible and those described above are not meant to encompass all possible charge transfer means configurations.

Velocity Based Charge Exchange Means FIG. 15A Thought FIG. 15C

The velocity based charge exchange means 670 comprises a speed measuring device 685 for measuring the velocity of moving fluid 16 and a three position switch 690. The three position switch 690 receives signals from speed measuring device 685 and from transducer 10. The signal from the speed measuring device describes the velocity of moving fluid 16.

FIG. 15A shows a neutral state 693 of the velocity based charge exchange means 670. In neutral state 693, three position switch 690 is in neutral position 696. The charge exchange means 670, in neutral state 693 and provides a means to transition between charge state 691 and recovery state 692. In neutral state 693, speed measuring device 685, measures a speed that is close to zero and three position switch 690 is in neutral position 696. The transducer 10 is in relaxed state 8. The neutral state 693 of velocity based charge exchange means 670 can correspond to stationary transducer 400 shown in FIG. 8A and FIG. 8B. The movable solid body 410 is blocking impingement of the transducer 10 of stationary transducer 400 by fluid 16. As a result, stationary transducer 400 is in relaxed state 8.

FIG. 15B shows charge state 691 of velocity based charge exchange means 670. The speed measuring device 685 measures a speed that increases from the near zero value to a maximum value. The transducer 10 stretches from relaxed state 8 to stretched state 6, as the speed increases to the maximum value. When the measured speed reaches the maximum value, three-position switch 685 moves from neutral position 696 to the charge position 697. An electric charge then flows from charge element 62 to transducer 10. The charge flow deposits low voltage charge 70 on transducer 10.

The charge state 691 shown in FIG. 14B can correspond to stationary transducer 400 shown in FIG. 8C and FIG. 8D. The movable solid body 410 is no longer blocking stationary transducer 400. Moving fluid 16 impinges and stretches transducer 10 to stretched state 6.

The three position switch 690 remains in charge position 697 until the measured fluid speed starts to drop. When measured speed starts to drop, the three position switch 690 moves back to neutral position 696 that is shown in FIG. 15A. The low voltage charge 70 remains on transducer 10. The fluid speed continues to drop and reaches the near zero value after the switch move back to the neutral position 696.

FIG. 15C shows recovery state 692 of velocity based charge exchange means 670. When the measured speed reaches the close to zero value, transducer 10 returns to back to relaxed state 8 and low voltage charge 70 is transformed to high voltage charge 80. The three position switch 690 moves from neutral position 696 to recovery position 686. The recovery position 686 allows transfer of the high voltage charge 80 from transducer 10 to recovery element 65. The voltage on transducer 10 in relaxed state 8 returns to low voltage value and the switch moves back to neutral position 696.

The recovery state 692 shown in FIG. 15C can correspond to FIG. 8A and FIG. 8B at a later time when movable solid body 410 has moved back to the position that blocks impingement of stationary transducer 400 by moving fluid 16.

The charge transfer means configurations described above are provided for illustrations purposes only. Many other charge transfer means configurations are possible and those described above are not meant to encompass all possible charge transfer means configurations.

CONCLUSIONS, RAMIFICATIONS, AND SCOPE OF INVENTION

Accordingly, the reader will see that the moving fluid energy conversion device of this invention can be used generate electrical energy from the energy contained in moving fluid. Thus, this invention can be used to generate electricity by the embodiments, describe herein, that cause moving fluid to stretch and relax transducers with electric charges in a way that generates electricity. These embodiments can include but are not limited to application of transducers to moving fluid lift based turbines, moving fluid drag based turbines, stationary transducer with solid moving bodies and transducers affixed to moving elements. The generated electricity can be added to the electricity generated by the moving fluid turbines. Thus, a low cost means is provided to increase the electricity generation capability of conventional moving fluid turbines. In addition, a low cost means is provide for harvesting energy contained moving fluid in aspects where were not previously possible for harvesting this energy. Furthermore, the moving fluid recovery device has additional advantages in that:

it provides a means for impingement of a transducer of a by a moving fluid where the moving fluid impingement causes the a transducer deflect from a relaxed state to a stretched state;

it provides a charge exchange means for transferring a low voltage electric charge from conditioning electronics to the transducer in the stretched state;

it provides a means for removing the moving fluid impingement from the stretched transducer, causing the transducer to return the relaxed state thereby transforming the low voltage electric charge to a high voltage electric charge;

it provides a charge exchange means for transferring the high voltage electric charge from the relaxed transducer to the conditioning electronics;

it provides a position based charge exchange means for charge exchange between the transducer and conditioning electronics;

it provides a velocity based charge exchange means that exchanges charge between the transducer and the conditioning electronics.

Although the description above contains many specificities these should not be construed as limiting the scope of the invention but merely providing illustrations of some of the presently preferred embodiments of this invention. For example, in another embodiment, single or multiple transducer assemblies can be affixed to the lift bodies of lift based moving fluid turbines, whereby the motion of the lift bodies causes the moving fluid impingement on the single or multiple transducers. In addition, single or multiple transducer assemblies can be affixed to the drag bodies of drag based moving fluid turbines, whereby the motion of the drag bodies causes the moving fluid impingement on the single or multiple transducers. In other embodiments, the segmented cylinder of charge exchange means could be a segmented disk with each conducting element of the conducting element pairs affixed opposite faces of the segmented disk. Or the segmented cylinder could be a hollow segmented cylinder with the conducting element pairs positioned on the inside surface of the hollow cylinder. In yet another embodiment, the velocity based charge exchange means can be replaced by a pressure based charge exchange means, where by the measured pressure of the moving fluid can activate the three way switch of the charge exchange means.

Thus the scope of the invention should be determined by the append claims and their legal equivalents, rather than by the examples given.

I claim:

1. A moving fluid energy conversion device for converting mechanical energy contained in a moving fluid, to electrical energy, said energy conversion device wherein the improvement comprises:
   a. one or more transducers, each transducer comprising one or more pairs of electrodes and one or more polymer spacers with the one or more spacers sandwiched between said one or more pairs of electrodes in a configuration that causes a change in electric field in response to deflection of a portion of said one or more polymer spacers; and
   b. one or more charge elements designed or configured to transfer electrical energy to said one or more pairs of electrodes when said portion of the spacer is deflected to a first position; and
   c. one or more recovery elements designed or configured to transfer electrical energy from said one or more pair of electrodes when said portion of the spacer is deflected to a second position; and
   d. one or more means for impinging said one or more transducers with said moving fluid causing said one or more polymer spacers to stretch from a relaxed state to a stretched state; and
   e. one or more means for removing said impinging moving fluid from said transducer causing said one or more polymer spaces to relax from said stretched state to said relaxed state; and
   f. one or more charge exchange means designed or configured to form one or more electrical connections between said one or more charge elements and said one or more pairs of electrodes when said one or more said polymer spacers are deflected to said first position and to form electrical connections between said one or more recovery elements and said two more electrodes when one or more said polymer spaces are deflected to said second position; and
   g. one or more transducers disposed on a lift based moving fluid turbine in a configuration where said moving fluid impinges said one or more transducers wherein said transducer is in a first position and said moving fluid impingement is prevented on one or more transducers when said lift based moving fluid turbine is in a second position.

2. The moving fluid energy conversion device of claim 1 wherein said one or more transducers are disposed on a lift based moving fluid turbine in a configuration where said moving fluid impinges said one more transducers and imparts a lift force when said one or more transducers are in a first position and said moving fluid impingement on said one or more transducers is prevented when said one or more transducers are in a second position.

3. The moving fluid energy conversion device of claim 1 wherein said one or more transducers are disposed on a drag based moving fluid turbine in configuration where said moving fluid impinges said one more transducers when said drag based moving fluid turbine is a first position and said moving fluid impingement is prevented on said one or more transducers when said drag based moving fluid turbine is in a second position.

4. A method for converting mechanical energy contained in a moving fluid to electrical energy, said energy conversion method provides:
   a. a transducer means providing one or more transducers wherein each transducer comprising one or more pairs of electrodes and one or more polymer spacers with the one or more spacers sandwiched between said one or more pairs of electrodes in a configuration that causes a change in electric field in response to deflection of a portion of said one or more polymer spacers; and
   b. a charge means that provides for one more charge elements designed or configured to transfer electrical energy to said one or more pairs of electrodes when said portion of the spacer is deflected to a first position; and
   c. a recovery means that provides for one or more recovery elements designed or configured to transfer electrical energy from said one or more pair of electrodes when said portion of the spacer is deflected to a second position; and
   d. a moving fluid impinging means that provides for impinging said one or more transducers with said moving fluid causing said one or more polymer spacers to stretch from a relaxed state to a stretched state; and
   e. an impingement removal means that provides for removing said impinging moving fluid from said transducer causing said one or more polymer spaces to relax from said stretched state to said relaxed state; and
   f. a charge exchange means that provides for charge exchange to one or more electrical connections between said one or more charge elements and said one or more pairs of electrodes when said one or more said polymer spacers are deflected to said first positions and to form electrical connections between said one or more recovery elements and said two more electrodes when one or more said polymer space are deflected to said second positions; and
   g. one or more transducers means disposed on a lift based moving fluid turbine that provides for a configuration where said moving fluid impinges said one or more transducers wherein said transducer is in a first position and said moving fluid impingement is prevented on said one or more transducers when said lift based moving fluid turbine is in a second position.

5. The method of claim 4 wherein said one or more transducers of said transducer means are disposed on a lift based moving fluid turbine in a configuration where said moving fluid impinges said one more transducers and imparts a lift force when said one or more transducers are in a first position and said moving fluid impingement on said one or more transducers is prevented when said one or more transducers are in a second position.

6. The method of claim 4 wherein said one or more transducers of said transducer means are disposed on a drag based moving fluid turbine in configuration where said moving fluid impinges said one more transducers when said drag based moving fluid turbine is a first position and said moving fluid impingement is prevented on said one or more transducers when said drag based moving fluid turbine is in a second position.

* * * * *